United States Patent
Horikawa

(10) Patent No.: US 6,721,034 B1
(45) Date of Patent: *Apr. 13, 2004

(54) STAGE UNIT, DRIVE TABLE, AND SCANNING EXPOSURE APPARATUS USING THE SAME

(75) Inventor: Hiroto Horikawa, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/327,621

(22) Filed: Jun. 8, 1999

Related U.S. Application Data

(62) Division of application No. 09/139,296, filed on Aug. 25, 1998, which is a continuation of application No. 08/935,445, filed on Sep. 23, 1997, now Pat. No. 5,850,280, which is a continuation of application No. 08/490,497, filed on Jun. 14, 1995, now abandoned.

(30) Foreign Application Priority Data

| Jun. 16, 1994 | (JP) | .............................. 6-156429 |
| Jul. 5, 1994 | (JP) | .............................. 6-153458 |
| Nov. 1, 1994 | (JP) | .............................. 6-268546 |

(51) Int. Cl.⁷ .................. G03B 27/42; G03B 27/62; G03B 27/32
(52) U.S. Cl. .................. 355/53; 355/75; 355/77
(58) Field of Search .................. 355/53, 67, 71, 355/50, 77, 75; 310/12, 53; 356/401; 250/492.2; 74/490.09

(56) References Cited

U.S. PATENT DOCUMENTS

| 4,737,823 A | 4/1988 | Bouwer et al. |
| 4,803,712 A | 2/1989 | Kembo et al. |
| 4,916,340 A | 4/1990 | Negishi |
| 4,952,060 A | 8/1990 | Ina et al. |

(List continued on next page.)

FOREIGN PATENT DOCUMENTS

| DE | 43 33 620 A1 | 4/1995 |
| EP | 0 421 527 A1 | 4/1991 |
| EP | 0 498 496 A1 | 8/1992 |
| JP | A-63-128713 | 6/1988 |
| JP | A-2-35709 | 2/1990 |

OTHER PUBLICATIONS

Micrascan II Descriptions, 1993.

*Primary Examiner*—Peter B. Kim
(74) *Attorney, Agent, or Firm*—Oliff & Berridge PLC

(57) ABSTRACT

It is an object of the present invention to reduce the weight of a stage unit and suppress heat generation of the driving unit of the stage, thereby improving the surface accuracy of the stage or measurement precision of an interferometer for measuring the position of the stage. A reticle base, a scanning stage mounted on the reticle stage and moved in the scanning direction, and a fine adjustment stage mounted on the scanning stage and capable of being finely moved in the X and Y directions and in the rotational direction are provided as a reticle stage. A first electromagnetic actuator for performing driving in the scanning direction, and a second electromagnetic actuator, having a smaller thrust than that of the first electromagnetic actuator, for performing driving in a direction perpendicular to the scanning direction are provided as the driving unit of the fine adjustment stage.

77 Claims, 12 Drawing Sheets

U.S. PATENT DOCUMENTS

| | | |
|---|---|---|
| 4,952,858 A | 8/1990 | Galburt |
| 5,194,893 A | 3/1993 | Nishi |
| 5,260,580 A | 11/1993 | Itoh et al. |
| 5,327,060 A | 7/1994 | Van Engelen et al. |
| 5,359,389 A | 10/1994 | Isohata |
| 5,477,304 A | 12/1995 | Nishi |
| 5,528,118 A | 6/1996 | Lee |
| 5,620,814 A | 4/1997 | Kley |
| 5,623,853 A * | 4/1997 | Novak et al. ............ 74/490.09 |
| 5,699,145 A * | 12/1997 | Makinouchi et al. ......... 355/53 |
| 5,767,948 A | 6/1998 | Loopstra et al. |
| 5,796,469 A | 8/1998 | Ebinuma |
| 5,850,280 A | 12/1998 | Ohtomo et al. |
| 5,874,820 A | 2/1999 | Lee |
| 6,124,923 A | 9/2000 | Horikawa |
| 6,211,946 B1 | 4/2001 | Ohtomo et al. |
| 6,262,797 B1 | 7/2001 | Horikawa |

\* cited by examiner

STAGE UNIT, DRIVE TABLE, AND SCANNING EXPOSURE APPARATUS USING THE SAME

This is a Division of application Ser. No. 09/139,296 filed Aug. 25, 1998, which in turn is a Continuation of application Ser. No. 08/935,445 filed Sep. 23, 1997 (now U.S. Pat. No. 5,850,280), which is a Continuation of application Ser. No. 08/490,497 filed Jun. 14, 1995 now ABN. The entire disclosure of the prior applications are hereby incorporated by reference herein in their entirety.

BACKGROUND OF THE INVENTION

1. Field of the Invention

The present invention relates to a stage unit having a means for limiting the moving range of a moving table on which a target positioning object is mounted, a drive table driven by a linear motor and capable of easily performing origin detection, and a scanning exposure apparatus for manufacturing semiconductor elements or the like by using the same.

2. Related Background Art

To manufacture semiconductor elements, liquid crystal display elements, or the like by using the photolithography technique, a projection exposure apparatus is conventionally used, in which a pattern formed on a reticle (or a photomask) is exposed, through a projection optical system, onto a wafer (or a glass plate) coated with a photoresist.

In recent years, one chip pattern of a semiconductor element or the like tends to become larger. For this reason, a projection exposure apparatus for exposing a pattern on a reticle, which has a larger size, onto a wafer is required. To meet such a requirement for increasing the exposure area with a so-called step and repeat type projection exposure apparatus for performing full exposure of the entire pattern on the reticle, the projection optical system must be made larger. However, this results in an increase in manufacturing cost of a projection optical system having high imaging performance on the entire surface of the wide exposure field.

Therefore, a so-called step and scan type scanning exposure apparatus has received a great deal of attention. In this apparatus, after each shot area of the wafer is moved to the scan start position, the reticle, which is being illuminated, is scanned in a direction crossing the optical axis of the projection optical system. In synchronism with this scanning, the wafer is scanned in the direction crossing the optical axis of the projection optical system, thereby exposing the pattern of the reticle onto each shot area of the wafer.

SUMMARY OF THE INVENTION

According to the present invention, there is provided a stage unit arranged in a scanning exposure apparatus which illuminates a mask on which a transfer pattern is formed, scans the mask in the first direction (Y direction or −Y direction) as a predetermined scanning direction, and synchronously scans a photosensitive substrate in a direction corresponding to the scanning direction, thereby sequentially exposing the pattern of the mask onto the photosensitive substrate, comprising a base, a scanning stage arranged to be freely moved in the first direction on the base, a fine adjustment stage, arranged to be freely moved, with respect to the scanning stage, within predetermined ranges in the first direction of a target scanning object and a second direction perpendicular to the first direction, for mounting the target scanning object thereon, a first electromagnetic actuator for driving the fine fu adjustment stage in the second direction with respect to the scanning stage, and a second electromagnetic actuator for driving the fine adjustment stage in the first direction with respect to the scanning stage with a larger thrust than that of the first electromagnetic actuator.

In this case, as each of the first and second electromagnetic actuators, an electromagnetic actuator of a moving magnet type in which a stationary member having a coil is fixed on the scanning stage side is used. Cooling means for cooling the stationary member of each of the first and second electromagnetic actuators by circulating a predetermined cooling fluid is preferably arranged.

In addition, a movable mirror fixed on the fine adjustment stage, and an interferometer for irradiating a measurement light beam on the movable mirror to detect a displacement of the fine adjustment stage with respect to the scanning stage are provided. The cooling means preferably circulates the cooling fluid from a portion near an optical path of the light beam from the interferometer.

Furthermore, one of the first and second electromagnetic actuators is preferably constituted by a pair of electromagnetic actuators which are parallelly arranged.

In the scanning exposure apparatus, a large a inertial force in the first direction as the scanning direction is applied to the fine adjustment stage particularly at the start and end of scanning.

According to the stage unit of the present invention, however, an actuator having a small thrust is used as the electromagnetic actuator for driving the fine adjustment stage in the second direction (X direction or −X direction) because the inertial force applied to the fine adjustment stage in the second direction which is not the scanning direction can be almost neglected. With this arrangement, the shape and weight of the movable member of the electromagnetic actuator can be reduced. For this reason, the overall weight of the fine adjustment stage is reduced, thereby improving the control performance of the stage. In addition, the capacity of the coil of the electromagnetic actuator in the second direction can also be reduced. Since a heat generation amount from the coil is also decreased, heat deformation of each stage is minimized, thereby minimizing the adverse influence of heat to the measurement equipment for position measurement.

When each of the first and second electromagnetic actuators is an electromagnetic actuator of a moving magnet type, and the cooling means for cooling the stationary member of each of the first and second electromagnetic actuators by circulating the predetermined cooling liquid is arranged, the fine adjustment stage is separated from the coil as a heat source. For this reason, the heat deformation of the fine adjustment stage can be minimized as compared to a case wherein an electromagnetic actuator of a moving coil type is used.

When the stationary member as a heat source is liquid-cooled, the total heat generation amount is minimized. It is mechanically easy to cool the stationary member in this manner.

The movable mirror fixed on the fine adjustment stage, and the interferometer for irradiating the measurement light beam on the movable mirror to detect the displacement of the fine adjustment stage with respect to the scanning stage are arranged, and the cooling fluid is circulated from the portion near the optical path of the light beam from the interferometer. In this case, when the cooling fluid has the largest cooling capability, the electromagnetic actuators are sequentially cooled from the portion near the optical path. For this reason, temperature adjustment of a gas on the optical path is stably performed, thereby maintaining a high measurement precision.

When one of the first and second electromagnetic actuators is constituted by a pair of electromagnetic actuators which are parallelly arranged, driving in the rotational direction is enabled by applying thrusts to the pair of electromagnetic actuators in opposite directions.

According to the present invention, there is provided a stage unit comprising a moving table for mounting a target positioning object thereon, a base for mounting the moving table thereon to be freely moved in a predetermined direction, driving means for driving the moving table in the predetermined direction with respect to the base, switch means for stopping an operation of the driving means when the moving table moves beyond an allowable movement range in the predetermined direction, and push-back means for generating a biasing force for pushing back the moving table to the allowable movement range side before the switch means operates.

In this case, the biasing force of the push-back means is preferably larger than the frictional force between the moving table and the base. At the same time, the biasing force is preferably a force within a range smaller than that of the driving force in the normal operation of the driving means.

An elastic member is used as an example of the push-back means.

A linear motor is used as an example of the driving means.

According to the present invention, when the moving table moves beyond the allowable movement range because of runaway and comes close to the switch means, the push-back means starts to apply the biasing force to the moving table to the allowable movement range side. When the moving table further moves, the switch means operates to stop the operation of the driving means. More specifically, the driving force of the driving means to the moving table is eliminated, and the moving table is stopped.

Even in this state, the push-back means is operating. Since the push-back means has a biasing force larger than the frictional force between the moving table and the base, the moving table is pushed back to the allowable movement range side. The switch means is set in an inoperative state, and driving of the moving table by the driving means is enabled. When, e.g., the control system of the driving means shifts to an error sequence upon operation of the switch means, and the driving means it driven upon completion of error processing, runaway of the moving table to the switch means side is prevented.

When the push-back means has an elastic member such as a coil spring or a rubber member, the biasing force can be generated by the elastic member with a simple arrangement without particularly adding a power source or the like.

When the driving means is constituted by a linear motor, and the switch means operates to stop supplying the driving power to the linear motor, the linear motor has no driving force at all. Therefore, only the frictional force and the biasing force from the push-back means act on the moving table, thereby easily pushing back the moving table to the allowable movement range side.

According to the present invention, there is provided a drive table comprising a driving system for two-dimensionally moving a table along an X direction and a Y direction, which are perpendicular to each other, X position detection means for detecting a position of the table along the X direction, Y position detection means for detecting the position of the table along the Y direction, θ detection means for detecting a rotation amount θ about a θ axis perpendicular to the X and Y directions of the table, X reference position detection means for detecting that a predetermined first position on the table reaches a predetermined X reference position on an X reference coordinate axis, Y reference position detection means for detecting that a predetermined second position on the table reaches a predetermined Y reference position on a Y reference coordinate axis, θ reference position detection means for detecting that a predetermined third position on the table reaches a predetermined θ reference position on another X or Y reference coordinate axis, and a calculation unit for converting detection values from the X position detection means, the Y position detection means, and the θ detection means into coordinate values on an X-Y reference coordinate plane on the basis of detection signals obtained from the X reference position detection means, the Y reference position detection means, and the θ reference position detection means and detection values from the X position detection means, the Y position detection means, and the θ detection means, which are obtained upon generation of the detection signals.

The driving system is preferably a non-contact type driving unit.

It is preferable that the X reference position detection means have an X position detection light-shielding plate arranged at the predetermined first position on the table, and an X reference position detection sensor, arranged at the predetermined X reference position, for generating a signal when the light-shielding plate reaches the X reference position, the Y reference position detection means have a Y position detection light-shielding plate fill arranged at the predetermined second position on the table, and a Y reference position detection sensor, arranged at the predetermined Y reference position, for generating a signal when the light-shielding plate reaches the Y reference position, the θ reference position detection means have a θ position detection light-shielding plate arranged at the predetermined third position on the table, and a θ reference position detection sensor, arranged at the predetermined θ reference position, for generating a signal when the light-shielding plate reaches the θ reference position, and the calculation means include reference rotation amount calculation means for obtaining a reference rotation amount about an axis perpendicular to the X-Y reference coordinate plane of the table from a shift between a detection signals from the θ reference position detection sensor and a detection signal from the X reference position detection means or the Y reference position detection means.

It is preferable that the X reference position detection means have X direction driving means for pressing an X direction side edge of the table against an X reference stopper provided on the reference coordinate axis in advance, and X press detection means for detecting that the X direction side edge is pressed against the X reference stopper, the Y reference position detection means have Y direction driving means for pressing a Y direction side edge of the table against a Y reference stopper provided on the reference coordinate axis in advance, and Y press detection means for detecting that the Y direction side edge is pressed against the Y reference stopper, the θ reference position detection means have θ direction driving means for pressing the X or Y direction side edge of the table against a θ reference stopper provided to be separated from the X or Y reference stopper on the reference coordinate axis by a predetermined distance, and θ press detection means for detecting that the X or Y direction side edge is pressed against the θ reference stopper, and the calculation means include rotation amount reset means for setting a detection value from rotation amount detection means to a reference rotation amount in accordance with a detection signal from the θ press detection means and a detection signal from the X or Y press detection means.

The drive table of the present invention has the reference position detection means for detecting that the predetermined positions on the table reach the predetermined reference positions on the reference coordinate axes for the three displacements, displacements in the X and Y directions of the table, and the rotation amount θ about the θ axis perpendicular to the X and Y directions, and the calculation means for converting the detection values from the position detection means, which are obtained upon generation of the detection signals obtained from the reference position detection means into the coordinate values on the reference coordinates. For this reason, origin detection with respect to the reference coordinate axes of the drive table can be precisely performed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
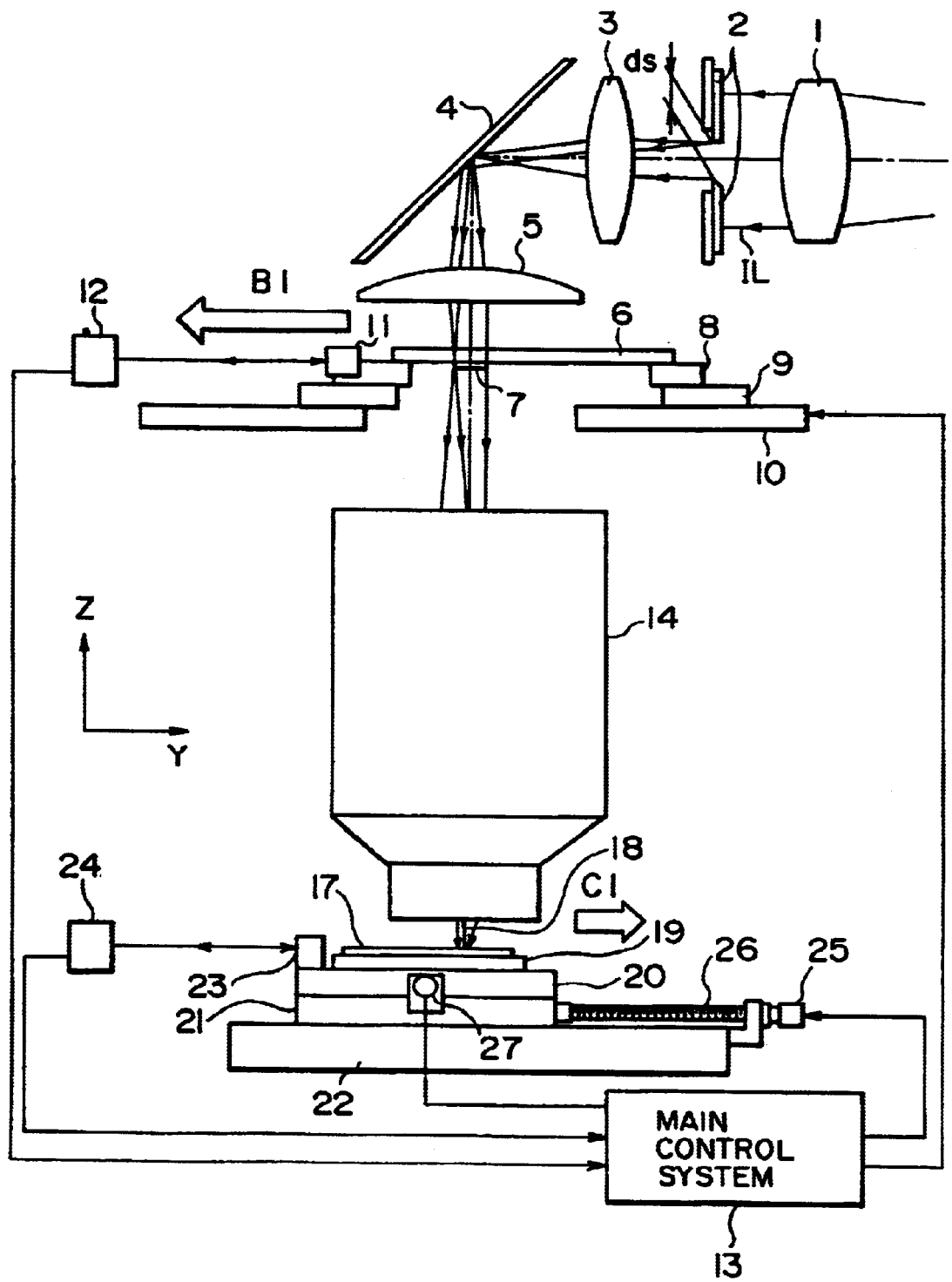
FIG. 1 is a view schematically showing the arrangement of a scanning exposure apparatus.

FIG. 1 is a view schematically showing the arrangement of a scanning exposure apparatus. Referring to FIG. 1, an illumination light beam IL from an optical integrator (not shown) in an illumination optical system illuminates a field stop 2 through a first relay lens 1. The illumination light beam passing through the slit-like opening of the field stop, 2 illuminates a slit-like illumination area 7 on a reticle 6 at a uniform illuminance through a second relay lens 3, a mirror 4 for deflecting the optical path, and an illumination condenser lens 5. The arrangement surface of the field stop 2 is conjugate with the pattern formation surface of the reticle 6. The projected image of the rectangular opening formed in the field stop 2 and having a width d, of the short side corresponds to the slit-like illumination area 7.

The pattern image of the reticle 6 in the illumination area 7 is formed and projected in a slit-like exposure area 18 on a wafer 17 through a projection optical system 14 which is telecentric on both the sides (or telecentric on one side). The Z axis is set parallel to the optical axis of the projection optical system 14. The X axis is set perpendicular to the sheet surface of FIG. 1 in a plane perpendicular to the Z axis. The Y axis is set parallel to the sheet surface of FIG. 1. The scanning direction is parallel to the Y axis.

The reticle 6 is held on a fine adjustment stage 8. The fine adjustment stage 8 is movably and rotatably mounted an a scanning stage 9 in the X-Y plane. The scanning stage 9 is mounted on a reticle base 10 so as to be driven by a linear motor (not shown) in the Y direction (or in the −Y direction) as the scanning direction. The coordinate values of the fine adjustment stage 8 along the Y and X directions, which are measured by a movable mirror 11 fixed at the end portion on the fine adjustment stage 8 and a laser interferometer 12 arranged outside, are supplied to a main control system 13. The main control system 13 controls the position of the fine adjustment stage 8 and the scanning speed of the scanning stage 9 on the basis of the supplied coordinate values.

On the other hand, the wafer 17 is mounted on an X stage 20 through a wafer holder 19. The X stage 20 is mounted on a Y stage 21 so as to be freely driven by a driving motor 27 in the X direction. The Y stage 21 is mounted on a unit base 22 so as to be freely driven by a driving motor 25 and a feed screw 26 in the Y direction. A Z stage for adjusting the portion of the wafer 17 along the Z direction, a leveling stage (not shown) for adjusting the inclination angle of the wafer 17, and the like are mounted on the X stage 20. The two-dimensional coordinate values of the X stage 20, which are measured by a movable mirror 23 fixed on the X stage 20 and a laser interferometer 24 arranged outside, are supplied to the main control system 13. The main control system 13 controls the operations of the driving motors 25 and 27 on the basis of the supplied coordinate values.

In scanning exposure, when the projection magnification of the projection optical system 14 is defined as β, the scanning stage 9 on the reticle side is scanned in a direction indicated by an arrow B1 at a speed $V_R$ under the control of the main control system 13. In synchronism with this scanning, the Y stage 21 on the wafer side is scanned in a direction indicated by an arrow C1 at a speed $V_V$ (=β·$V_R$), thereby sequentially projecting and exposing the pattern image of the reticle 6 onto the wafer 17.

Figure 2:
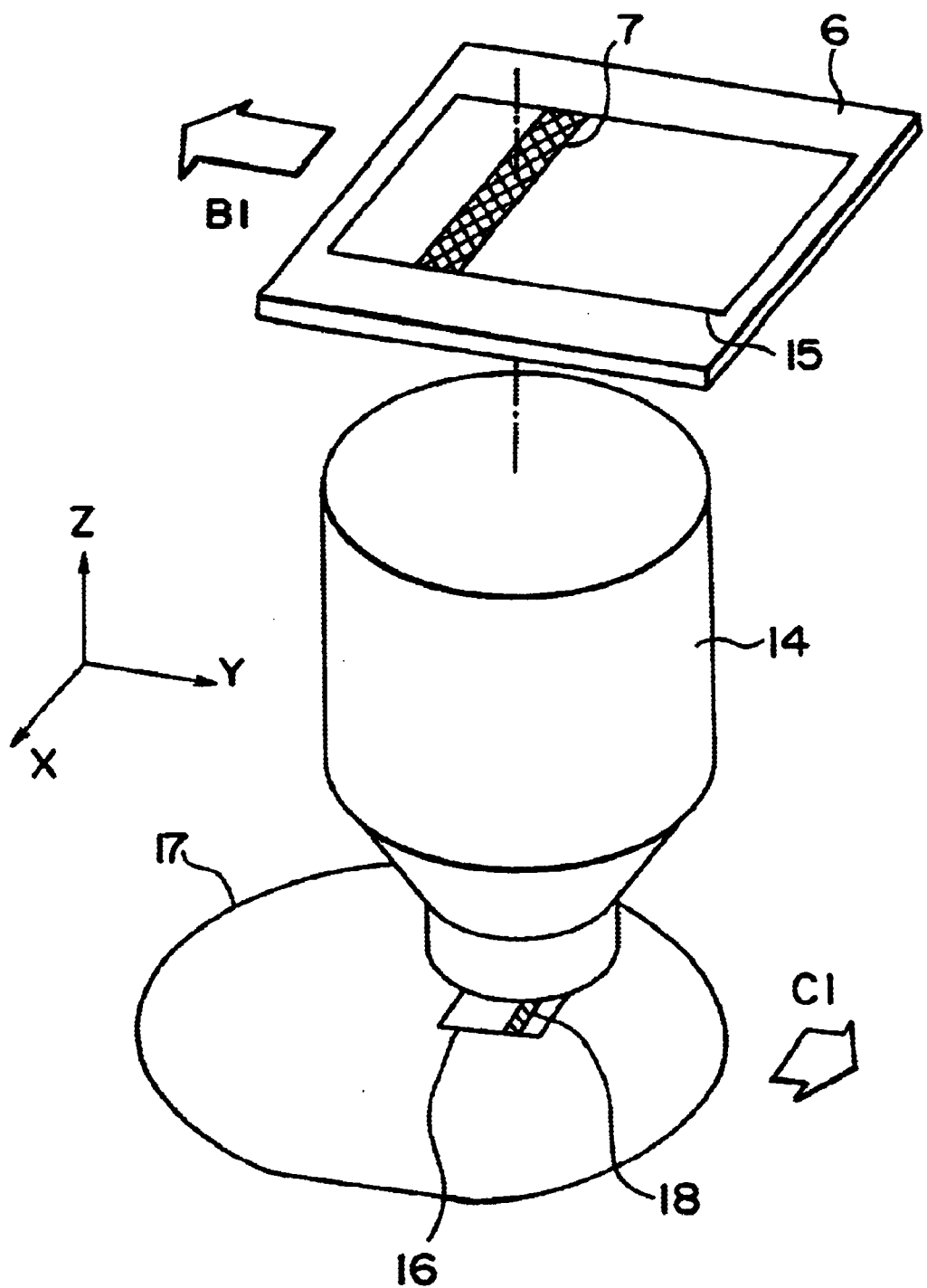
FIG. 2 is a perspective view for explaining synchronous scanning in the scanning exposure apparatus shown in FIG. 1.

FIG. 2 is a perspective view showing synchronous scanning. Referring to FIG. 2, a pattern area 15 of the reticle 6 is scanned in the direction indicated by the arrow B1 with respect to the hatched slit-like illumination area 7. In synchronism with this scanning, a shot area 16 of the wafer 17 is scanned in the direction indicated by the arrow C1 with respect to the hatched exposure area 18. With this operation, the pattern image in the pattern area 15 of the reticle 6 is sequentially exposed onto the shot area 16.

Figure 3:
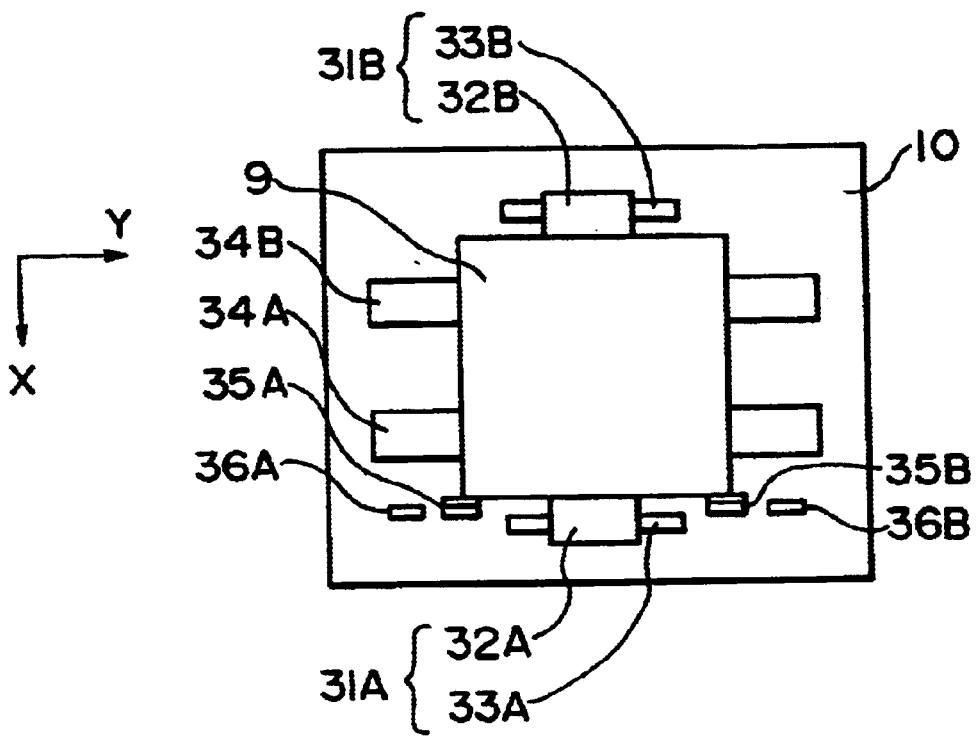
FIG. 3 is a plan view showing a reticle stage.
Figure 4:
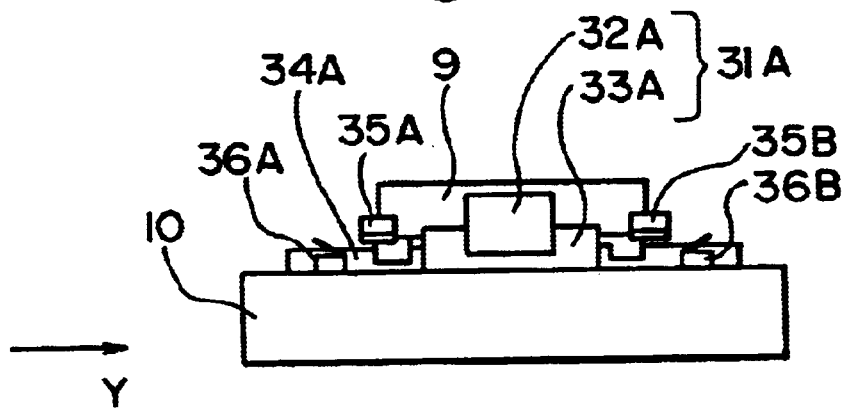
FIG. 4 is a front view of the reticle stage shown in FIG. 3.

FIG. 3 is a plan view of the reticle stage in FIG. 1. FIG. 4 is a side view of the reticle stage. As shown in FIG. 3, the scanning stage 9 is mounted to be moved in the Y direction along linear guides 34A and 34B on the reticle base 10, which are parallel to the Y axis. A first linear motor 31A is constituted by a stationary member 33A and a movable member 32A while a second linear motor 31B is constituted by a stationary member 33B and a movable member 32B. The stationary members 33A and 33B are fixed on the reticle base 10 to be parallel to the linear guides 34A and 34B. The movable members 32A and 32B are fixed to the scanning stage 9 along the stationary members 33A and 33B. The scanning stage 9 is driven by the two linear motors 31A and 31B in the +Y or −Y direction with respect to the reticle base 10.

As shown in FIG. 1, the fine adjustment stage 8 is mounted on the scanning stage 9. The fine adjustment stage 8 can be finely moved by a driving system (not shown) in the X and Y directions with respect to the scanning stage 9 and also can be finely rotated in the θ direction on the scanning stage 9.

As for a method of driving the fine adjustment stage of this type, three mechanical systems for converting the rotational movement of a servo motor into a linear movement are used, and the fine adjustment stage is moved by the three mechanical systems in the X, Y, and θ directions.

A system using an electromagnetic actuator is also proposed as a two-dimensional stage driving system (e.g., Japanese Patent Laid-Open No. 2-35709). In this system, thrusts in the two driving directions are equal to each other. Additionally, the system is heavy, and no countermeasure is made against deformation due to heat generation.

In the fine adjustment stage using such an electromagnetic actuator, the thrusts and shapes of two electromagnetic actuators for moving the fine adjustment stage in the two directions are equal regardless of the driving directions. Particularly, although the scanning exposure apparatus requires a smaller thrust to move the fine adjustment stage in a direction perpendicular to the scanning direction than in the scanning direction, an electromagnetic actuator having an excessive thrust is used. Therefore, the fine adjustment stage becomes heavy, and the heat generation amount also increases.

When the fine adjustment stage becomes heavy, the natural frequency becomes lower, so the response speed cannot be increased. In addition, the fine adjustment stage is deformed due to heat generation of the coil of the electromagnetic actuator, resulting in a degradation in accuracy of the reticle holding surface or the reflecting mirror holding surface. Furthermore, heat generation of the coil degrades the measurement precision of the measurement system such as an interferometer for detecting the position of the fine adjustment stage. For example, when an interferometer is used, heat generation of the coil causes an increase in ambient temperature, which causes variations or fluctuations in temperature of air on the optical path of the interferometer, resulting in an error in measurement value.

First Embodiment

The first embodiment associated with a stage unit according to the present invention will be described below with reference to FIGS. 5 to 7. In this embodiment, the present invention is applied to the reticle stage of a step and scan type projection exposure apparatus. The same reference numerals as in FIGS. 1 to 4 denote the same parts in FIGS. 5 to 7, and a detailed description thereof will be omitted.

Figure 5:
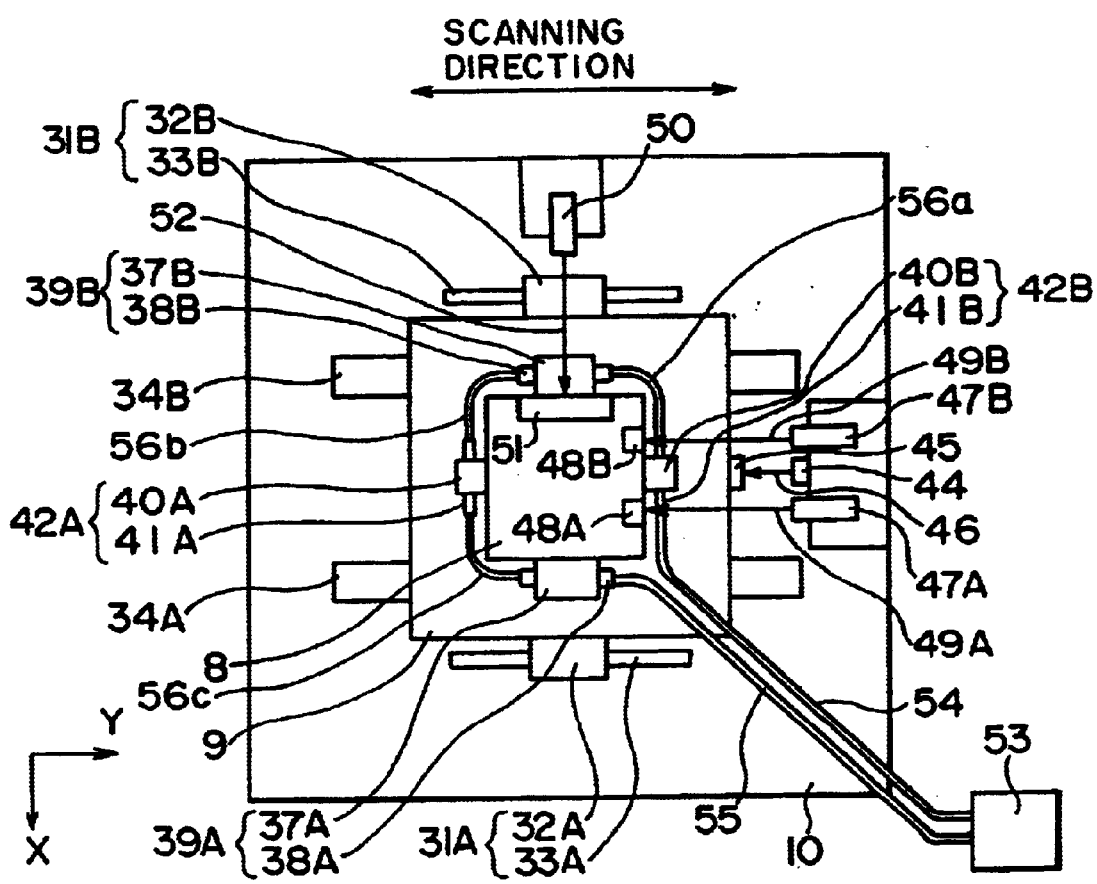
FIG. 5 is a plan view showing an embodiment of a stage unit according to the present invention.

FIG. 5 is a plan view of the reticle stage of this embodiment. Referring to FIG. 5, a scanning stage 9 is mounted on a base 10 to be slidable in the Y direction along linear guides 34A and 34B. The scanning stage 9 is driven by linear motors 31A and 31B in the +Y or −Y direction with respect to the reticle base 10. A Y axis movable mirror 45 is fixed at the end portion of the scanning stage 9 in the Y direction. A laser beam from an external laser interferometer 44 is irradiated on the movable mirror 45 to be parallel to the Y axis, as indicated by an optical path 46. The Y coordinate of the scanning stage 9 is obtained from the measurement value from the laser interferometer 44.

A fine adjustment stage 8 is mounted on the scanning stage 9 to be finely moved by a driving system (to be described later) in the X and Y directions and in the rotational direction (θ direction). A reticle 6 (FIG. 6) having an original pattern is held, by, e.g., vacuum suction, on the fine adjustment stage 8 having an opening (not shown) at the central portion. An exposure illumination light beam from an illumination optical system (not shown) is irradiated on a slit-like illumination area in the pattern formation area on the lower surface of the reticle. In scanning exposure, the reticle is scanned through the scanning stage 9 at a predetermined speed in the +Y or −Y direction as the widthwise direction of the illumination area. Position adjustment is performed by the fine adjustment stage 8 as needed.

Y axis movable mirrors 48A and 48B are fixed at the and portion of the fine adjustment stage 8 in the Y direction. Laser beams from external laser interferometers 47A and 47B are irradiated on the movable mirrors 48A and 48B to be parallel to the Y axis, as indicated by optical paths 49A and 49B. The Y coordinate of the fine adjustment stage 8 is obtained from the average value of the measurement values from the interferometers 47A and 47B. The rotation angle of the fine adjustment stage 8 is obtained from the difference between the measurement values from the interferometers 47A and 47B. An X axis movable mirror 51 is fixed at the end portion of the fine adjustment stage 8 in the X direction. A laser beam from an external laser interferometer 50 is irradiated on the movable mirror 51 to be parallel to the X axis, as indicated by an optical path 52. The X coordinate of the fine adjustment stage 8 is obtained from the measurement value from the laser interferometer 50. The position of the scanning stage 9 along the Y direction and the scanning speed are controlled on the basis of the X coordinate, the Y coordinate, and the rotation angle, which are obtained in the above manner, and the position and the rotation angle of the fine adjustment stage 8 are simultaneously controlled.

Figure 6:
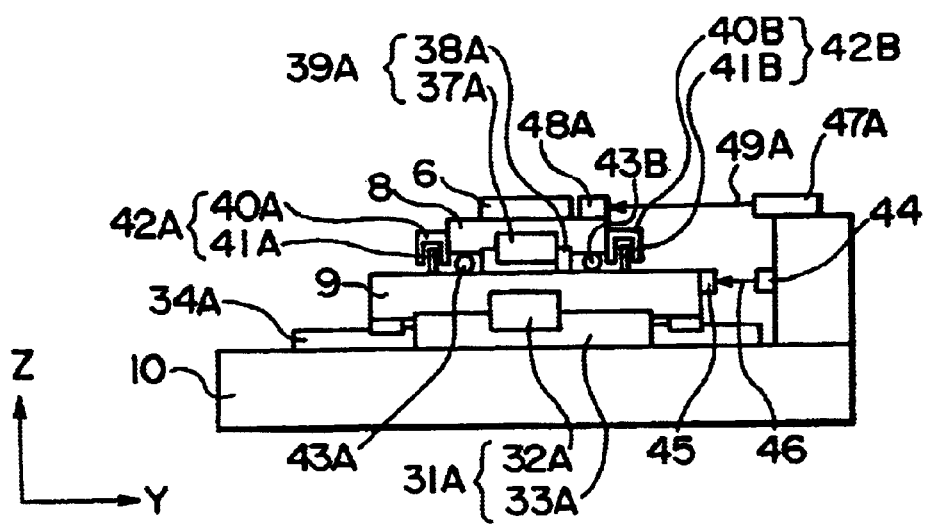
FIG. 6 is a front view of the stage unit shown in FIG. 5.

As shown in FIG. 6, a plurality of spherical rollers (only rollers 43A and 43B are illustrated in FIG. 6) are arranged between the fine adjustment stage 8 and the scanning stage 9. The fine adjustment stage 8 is smoothly moved on the plane of the scanning stage 9 through these rollers 43A and 43B.

The driving system of the fine adjustment stage 8 will be described below in detail.

As shown in FIGS. 5 and 6, electromagnetic actuators 39A and 39B each constituted by a moving magnet type (MM type) linear motor for mainly driving the fine adjustment stage 8 in the Y direction as the scanning direction in scanning exposure are provided on the side surfaces of the fine adjustment stage 8 in the +X and −X directions, respectively. The electromagnetic actuator 39A is constituted by a movable member 37A fixed on the side surface of the fine adjustment stage 8 in the +X direction and a stationary member 38A fixed to the scanning stage 9. When a current flows through the stationary member 38A incorporating a coil, a linear force is applied to the movable member 37A incorporating a magnet thereby moving the movable member 37A in the Y or −Y direction. When the current inversely flows, the moving direction is reversed. All electromagnetic actuators used to drive the fine adjustment stage 8 in this embodiment are MM type linear motors and similarly operate.

The fine adjustment stage 8 is driven in the +Y, the −Y, or the rotational direction by the electromagnetic actuator 39B constituted by a movable member 37B fixed on the side surface of the fine adjustment stage 8 in the −X direction and a stationary member 38B fixed to the scanning stage 9, and the above electromagnetic actuator 39A. Driving in the rotational direction is performed within a range not to bring the movable members 37A and 37B into contact with the stationary members 38A and 38B.

Electromagnetic actuators 42A and 42B for mainly driving the fine adjustment stage 8 in the X direction as a direction perpendicular to the scanning direction are arranged on the side surfaces of the fine adjustment stage 8 in the −Y and +Y directions, respectively. The electromagnetic actuator 42A is constituted by a movable member 40A fixed on the side surface of the fine adjustment stage 8 in the −Y direction and a stationary member 41A fixed to the scanning stage 9. The electromagnetic actuator 42B is constituted by a movable member 40B fixed on the side surface of the fine adjustment stage 8 in the +Y direction and a stationary member 41B fixed to the scanning stage 9. The fine adjustment stage 8 is driven by the electromagnetic actuators 42A and 42B in the +X, the −X, or the rotational direction.

Both of the electromagnetic actuators 42A and 42B have a thrust smaller than that of the electromagnetic actuators 39A and 39B used for the scanning direction.

The operations of the electromagnetic actuators and the fine adjustment stage 8 will be briefly described below. While the scanning stage 9 is moving in the scanning direction at a constant speed, the fine adjustment stage 8 can be driven in the X direction by applying a thrust to the two electromagnetic actuators 42A and 42B in the same direction. Similarly, the fine adjustment stage 8 can be driven in the Y direction by applying a thrust to the two electromagnetic actuators 39A and 39B in the same direction.

In addition, the fine adjustment stage 8 can be rotated by applying thrusts in the opposing directions to the two electromagnetic actuators 42A and 42B for driving the fine adjustment stage 8 in the X direction. The electromagnetic actuators 39A and 39B in the Y direction also similarly operate.

When the scanning stage 9 is accelerated/decelerated in the scanning direction (Y direction) in scanning exposure, a large inertial force is generated to the fine adjustment stage 8 in the Y direction by this acceleration. However, this inertial force can be canceled by the thrusts of the electromagnetic actuators 39A and 39B, thereby setting the relative speed between the fine adjustment stage 8 and the scanning stage 9 to zero. A thrust required to cancel the inertial force in the scanning direction (Y direction) is larger than that required in the direction (X direction) perpendicular to the scanning direction. As the electromagnetic actuators 39A and 39B, large actuators having larger thrusts are used.

In this embodiment, a cooling means for removing heat generated from the electromagnetic actuators 39A, 39B, 42A, and 42B are provided. This cooling means will be described below with reference to FIGS. 5 and 7.

Referring to FIG. 5, the stationary members 38A, 38B, 41A, and 41B of the electromagnetic actuators 39A, 39B, 42A, and 42B are arranged in a circulating cooling path (to be described later), adjusted to a predetermined temperature by a liquid cooling temperature adjustment unit 53, and cooled by a cooling fluid supplied from an internal circulating pump. The circulating cooling path starting from the liquid cooling temperature adjustment unit 53 is sequentially serially constituted by a cooling fluid circulating tube 54, the stationary member 41B, a cooling fluid circulating tube 56a, the stationary member 38B, a cooling fluid circulating tube 56b, the stationary member 41A, a cooling fluid circulating tube 56c, the stationary member 38A, a cooling fluid circulating tube 55, returning to the liquid cooling temperature adjustment unit 53. The cooling fluid starts to flow from the cooling fluid circulating tube 54 near the optical path 49A of the laser interferometer, and passes through the cooling fluid circulating tube 56a near the optical path 49B of the laser interferometer and immediately through the stationary member 38B near the optical path 52 of the laser interferometer. Therefore, the temperature in the optical paths 49A, 49B, and 52 of the laser interferometers is precisely maintained at a predetermined level.

Figure 7:
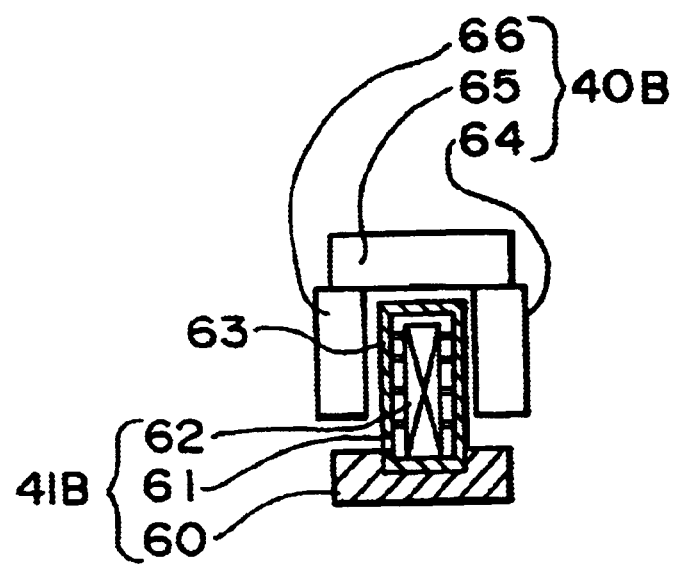
FIG. 7 is a sectional view of an electromagnetic actuator shown in FIG. 6.

FIG. 7 is a sectional view of the electromagnetic actuator 42B in FIG. 6 along a plane parallel to the sheet surface of FIG. 6. As shown in FIG. 7, the stationary member 41B is constituted by a base 60, a hollow cover 61 fixed on the base 60, and a coil 62 accommodated in the cover 61. In this case, to cool the coil 62, a cooling fluid 63 flows between the coil 62 and the cover 61. If the coil 62 has satisfactory insulating properties, e.g., water can be used as the cooling fluid 63. However, as the cooling fluid 63, a chemically inert fluid having no corrosiveness against the coil 62 and the cover 61 and no conductivity is preferable. In this embodiment, therefore, e.g., a fluorine-based inert fluid is used as the cooling fluid 63.

On the other hand, the movable member 40B is constituted by fixing a pair of magnets 64 and 66 to a fixing plate 65 above the stationary member 41B such that the stationary member 41B is sandwiched therebetween. That is, the electromagnetic actuator 42B of this embodiment is of a moving magnet type having magnets incorporated in the movable member 41B. In this case, since the coil 62 as a main heat source is incorporated on the stationary member 41B side, the coil 62 can be easily cooled. The remaining electromagnetic actuators 39A, 39B, and 42A also have as the same arrangement.

As described above, when electromagnetic actuators having the same thrust regardless of the scanning direction and the direction perpendicular to this direction are used, an actuator having an excessive thrust is used as the electromagnetic actuator for applying a thrust in the direction perpendicular to the scanning direction. As a result, the entire stage becomes heavy to cause an increase in cost. In this embodiment, however, electromagnetic actuators having appropriate thrusts in the scanning direction and in the direction perpendicular to this direction are used. As a result, the weight of the entire stage is decreased, the heat generation amount is decreased, and cost is reduced.

According to this embodiment, cooling is efficiently performed by circulating the heat absorption fluid without leaking the heat mainly generated in the coil in the stationary member of the electromagnetic actuator to the scanning stage 9, the fine adjustment stage 8, and the like as radiated heat, or conducted heat. In addition, the influence of the temperature or the fluctuation of air with respect to the laser beams can be minimized.

In this embodiment, a linear motor is used as the electromagnetic actuator. Even if a voice coil motor is used in place of the linear motor, the same effect can be obtained. In this embodiment, the electromagnetic actuators are serially connected and cooled. However, the electromagnetic actuators can also be parallelly cooled. The parallel cooling method is advantageous in that the electromagnetic actuators can be cooled under the same conditions. However, this method has a difficulty in control because piping becomes complex, and if a single temperature adjustment unit is used, the cooling fluid flows toward a lower pressure.

In this embodiment, the stage unit of the present invention is applied to the reticle stage used in a step and scan type projection exposure apparatus. However, the stage unit of the present invention can also be applied to the wafer stage in addition to the reticle stage.

As shown in FIGS. 3 and 4, a pair of microswitches 36A and 36B serving as limit switches are fixed on the reticle base 10 along the linear guide 34A so as to sandwich the scanning stage 9. In correspondence with the microswitches 36A and 36B, a pair of operation plates 35A and 35B are attached to the scanning stage 9. In this case, while the two microswitches 36A and 36B are open, a driving power is supplied to the linear motors 31A and 31B. As shown in FIG. 4, when the scanning stage 9 is moved in the −Y direction, and the operation plate 35A is brought into contact with the microswitch 36A to close the microswitch 36A, the driving power to the linear motors 31A and 31B is stopped, and the scanning stage 9 stops in the closed state of the microswitch 36A. To supply the driving power to the linear motors 31A and 31B again, the scanning stage 9 must be manually pushed back in the movable range (a range to supply the driving power to the linear motors 31A and 31B) in the +Y direction to open the microswitch 36A.

Similarly, the scanning stage 9 is moved in the +Y direction, and the operation plate 35B is brought into contact with the microswitch 36B to close the microswitch 36B, the driving power to the linear motors 31A and 31B is stopped. To supply the driving power to the linear motors 31A and 31B again, the scanning stage 9 must be manually pushed back in the movable range in the −Y direction.

As described above, in the reticle stage shown in FIGS. 3 and 4, the movable range of the scanning stage 9 is set by the microswitches 36A and 36B. To return the scanning stage 9 in the movable range again after the microswitches 36A and.36B are closed, the scanning stage 9 must be manually pushed back in the movable range. For this purpose, if the scanning stage 9 is moved beyond the movable range during the exposure process, the operator must open the chamber for accommodating the exposure apparatus and interrupt the exposure process to manually move the scanning stage 9. In this case, the temperature in the exposure apparatus changes upon opening/closing the chamber. Until the temperature is stabilized, the exposure process must be interrupted, resulting in a decrease in throughput (productivity) of the exposure process.

Similarly, in, e.g., the wafer stage of the scanning exposure apparatus, or in a normal full exposure type exposure apparatus (e.g., a stepp r), when the movable range of the stage is limited by a microswitch, and the driving power to the driving unit is stopped if the stage is moved beyond the movable range, the stage must be manually pushed back in the movable range. For this reason, the throughput of the exposure process is decreased.

Second Embodiment

The second embodiment associated with the stage unit according to the present invention will be described below with reference to FIGS. 8 to 13. In this embodiment, the present invention is applied to the reticle stage of a step and scan type projection exposure apparatus. The same reference numerals as in FIGS. 1 to 4 denote the same parts in FIGS. 8 and 9, and a detailed description thereof will be omitted.

Figure 8:
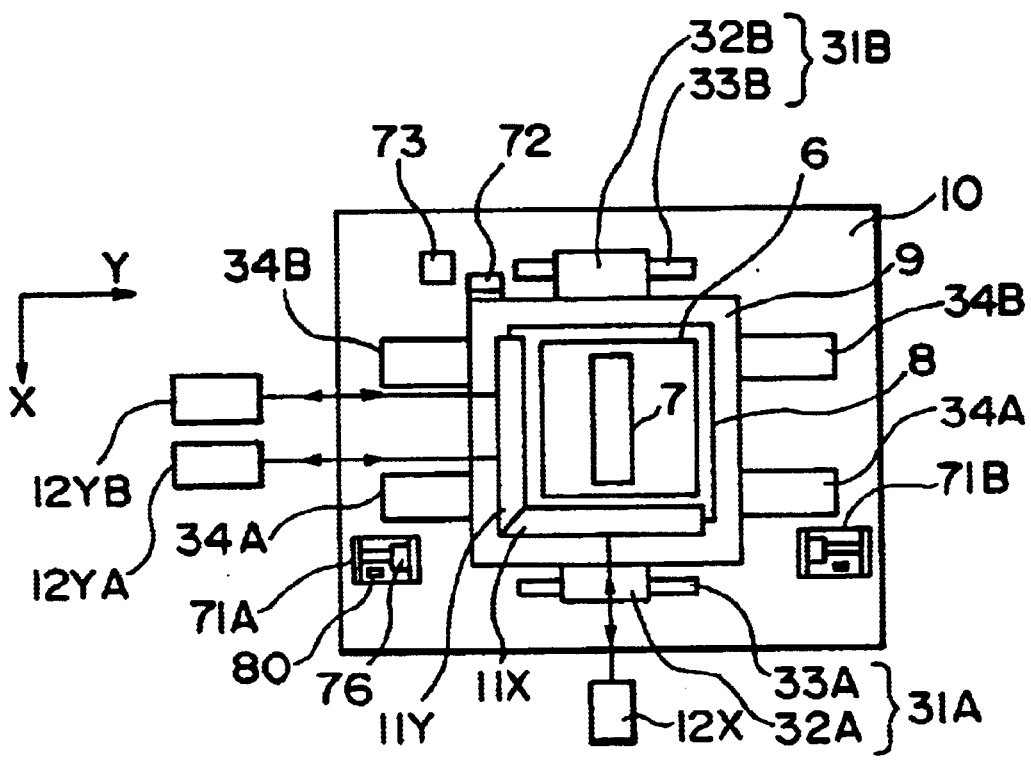
FIG. 8 is a plan view showing a reticle stage as an embodiment of the stage unit according to the present invention.

FIG. 8 is a plan view of the reticle stage of this embodiment. Referring to FIG. 8, a scanning stage 9 is mounted on a base 10 to be slidable in the Y direction along linear guides 34A and 34B. The scanning stage 9 is driven by linear motors 31A and 31B in the +Y or −Y direction with respect to the base 10. A sliding portion 9a (FIG. 9) is formed on the lower surface of the scanning stage 9 so as to oppose one linear guide 34A while a sliding portion 9b (FIG. 13) is formed to oppose the other linear guide 34B. Bearings 90 are interposed between the linear guides 34A and 34B and the sliding portions 9a and 9b.

A Y axis movable mirror 11Y is fixed at the end portion of a fine adjustment stage 8 in the Y direction. Laser beams from two external laser interferometers 12YB and 12YA are irradiated on the movable mirror 11Y to be parallel to the Y axis. The Y coordinate of the fine adjustment stage 8 is obtained from the average value of the measurement values from the laser interferometers 12YB and 12YA, and the rotation angle of the fine adjustment stage 8 is obtained from the difference between the measurement values from the laser interferometers 12YB and 12YA. An X axis movable mirror 11X is fixed at the end portion of the fine adjustment stage 8 in the X direction. A laser beam from an external laser interferometer 12X is irradiated on the movable mirror 11X to be parallel to the X axis. The X coordinate of the fine adjustment stage 8 is obtained from the measurement value from the laser interferometer 12X. The position and the scanning speed of the scanning stage 9 along the Y direction are controlled on the basis of the X coordinate, the Y coordinate, and the rotation angle, which are measured in the above manner, and the position and rotation angle of the fine adjustment stage 8 are simultaneously controlled.

A reference plate 72 is fixed to the side surface portion of the scanning stage 9 in the X direction. An origin sensor 73 is fixed at a position where the reference plate 72 on the base 10 passes.

Figure 13:
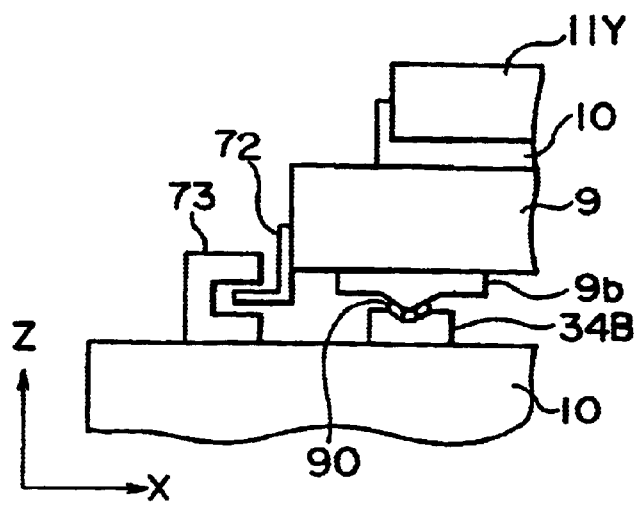
FIG. 13 is an enlarged view of the main part so as to explain the relationship between a reference plate and an origin sensor shown in FIG. 8.

FIG. 13 is a view showing the positional relationship between the reference plate 72 and the origin sensor 73. Referring to FIG. 13, the origin sensor 73 is constituted by a light-emitting portion and a light-receiving portion. When the reference plate 72 passes between the light-emitting portion and the light-receiving portion in the Y direction, an origin signal is generated from the light-receiving portion. In this embodiment, e.g., at the start of use the reticle stage, the origin signal is used to reset the measurement values from the laser interferometers 12YA and 12YB.

Referring back to FIG. 8, a pair of limit switch units 71A and 71B are fixed on the base 10 to sandwich the scanning stage 9 in the Y direction.

Figure 9:
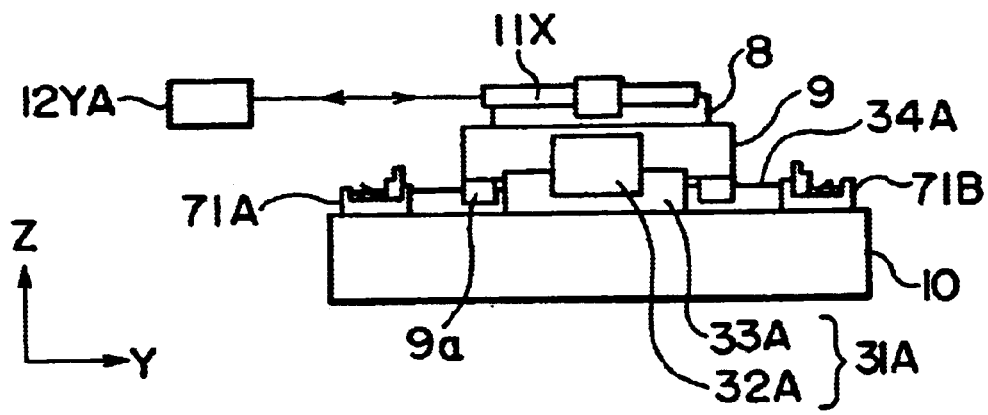
FIG. 9 is a front view of the reticle stage shown in FIG. 8.

FIG. 9 is a front view of FIG. 8. As shown in FIG. 9, when the scanning stage 9 is moved in the −Y or +Y direction, the bottom portion of the scanning stage 9 is brought into contact with the limit switch unit 71A or 71B, and the driving power to the linear motors 31A and 31B is stopped, as will be described later. More specifically, the allowable movement range of the scanning stage 9 in the Y direction is defined by the limit switch units 71A and 71B.

Figure 10:
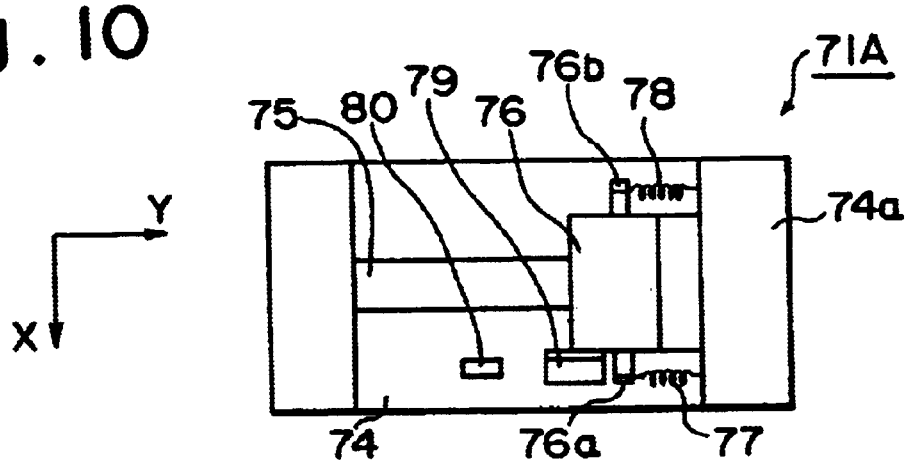
FIG. 10 is an enlarged plan view showing a limit switch shown in FIG. 8.
Figure 11:
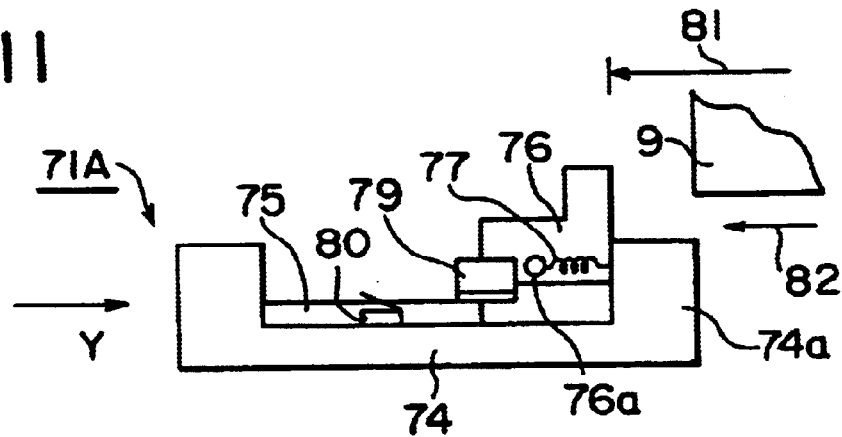
FIG. 11 is a front view of the limit switch shown in FIG. 10.

FIG. 10 is an enlarged plan view of the limit switch unit 71A in FIG. 8. FIG. 11 is an enlarged front view of the limit switch unit 71A. In the limit switch unit 71A shown in FIGS. 10 and 11, a linear guide 75 is formed in the Y direction in a frame 74 having a U-shaped section in the Y-Z plane. A movable member 76 is slidably mounted along the linear guide 75. Tensile coil springs 77 and 78 are mounted between projecting portions 76a and 76b on both the side surfaces of the movable member 76 and a side wall 74a of the frame 74 in the +Y direction, respectively. The movable member 76 is pressed against the side wall 74a side by the tensile coil springs 77 and 78. When the movable member 76 is in contact with the side wall 74a, the total biasing force of the tensile coil springs 77 and 78 is set to be larger than the frictional force between the scanning stage 9 and the base 10 and at the same time smaller than the average driving force of the linear motors 31A and 31B.

An operation plate 79 is fixed on the side surface of the movable member 76, and a microswitch 80 is fixed at a position where the operation plate 79 passes on the frame 74. Two circuits are parallelly arranged in the microswitch 80. Each of these two circuits is connected in a corresponding one of the driving current supply cables of each of the linear motors 31A and 31B. When the microswitch 80 is brought into contact with the operation plate 79 and closed, the microswitch 80 is set in an operative state, and the internal circuits are turned off, thereby stopping supply of the driving current to the linear motors 31A and 31B. When the operation plate 79 is separated to open the microswitch the microswitch 80 is set in an inoperative state, and the internal circuits are turned on, thereby driving the linear motors 31A and 31B. The other limit switch unit 71B in FIG. 8 has a structure symmetrical with that of the limit switch unit 71A in FIG. 10.

The operation of this embodiment will be described below. Referring to FIG. 11, an area in the Y direction, which is sandwiched between the movable member 76 and the movable member of the limit switch unit 71B (FIG. 8) is defined as an allowable movement range 81. At this time, the scanning stage 9 is moved in a direction indicated by an arrow 82 (−Y direction) upon runaway of the linear motors 31A and 31B in FIG. 8 beyond the allowable movement range 81, the scanning stage 9 starts to press the movable member 76.

Figure 12:
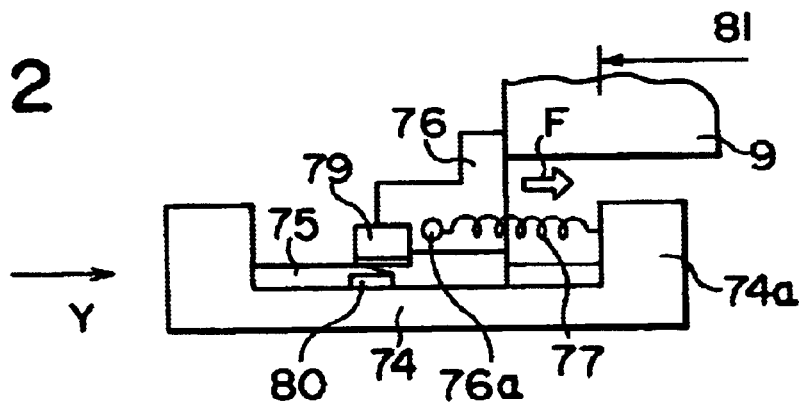
FIG. 12 is a front view showing the closed state of a microswitch.

Thereafter, as shown in FIG. 12, the movable member 76 is pressed by the scanning stage 9 and moved in the −Y direction along the linear guide 75. The operation plate 79 fixed to the movable member 76 closes the microswitch 80. In this state, supply of the driving current to the linear motors 31A and 31B is stopped, and the driving force of the scanning stage 9 is eliminated. In this case, since the tensile coil springs 77 and 78 have a sufficient biasing force P for pushing back the scanning stage 9 in the +Y direction, the movable member 76 pushes back the scanning stage 9 in the +Y direction. In addition, the microswitch 80 is opened to allow to supply the driving current to the linear motors 31A and 31B.

In this embodiment, however, when the microswitch 80 is closed to stop the driving current, the driving system (not shown) of the linear motors 31A and 31B sets the driving current to the linear motors 31A and 31B to, e.g., zero, thereby informing error occurrence to the host computer (not shown). Thereafter, when the error is restored, supply of the driving current to the linear motors 31A and 31B is started. The scanning stage 9 is returned in the allowable movement range 81 by the movable member 76.

The measurement values from the laser interferometers 12YA and 12YB in FIG. 8 may have an error because of runaway or the like. For this reason, when the error is restored, the linear motors 31A and 31B are driven to move the scanning stage 9 in the −Y direction such that the reference plate 72 moves across the origin sensor 73. At this time, an origin signal obtained from the origin sensor 73 is used to reset the measurement values from the laser interferometers 12YA and 12YB. With this operation, the Y coordinate of the scanning stage 9 is always accurately measured.

As described above, according to this embodiment, after the microswitch 80 is closed to stop the driving current to the linear motors 31A and 31B, the movable member 76 serving as a push-back means pushes back the scanning stage 9 to the allowable movement range 81. For this reason, the operator need not manually push back the scanning stage 9. Therefore, the exposure process of the scanning exposure apparatus using the reticle stage in FIG. 8 is not interrupted for a long time, resulting in an increase in throughput of the exposure process.

The first modification of the limit switch 71A on the left side of FIG. 8 will be described below with reference to FIGS. 14 and 15. The same reference numerals as in FIGS. 8 to 13 denote the same parts in FIGS 14 and 15, and a detailed description thereof will be omitted.

Figure 14:
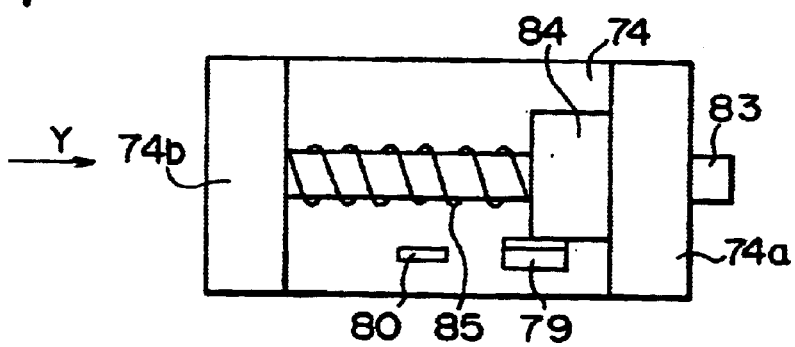
FIG. 14 is an enlarged plan view showing the first modification of the limit switch shown in FIG. 10.
Figure 15:
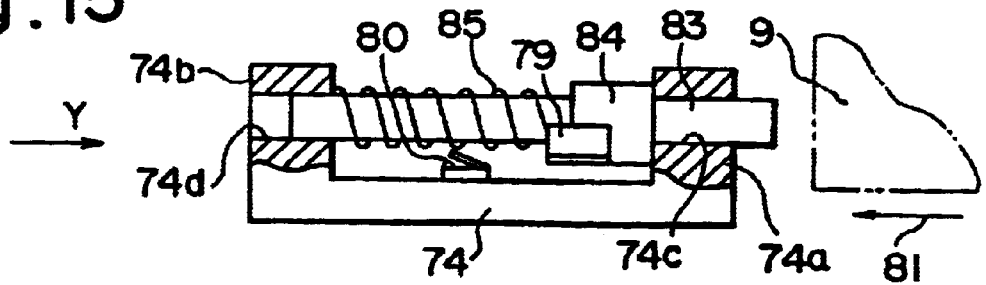
FIG. 15 is a partially cutaway front view of the limit switch shown in FIG. 14.

FIG. 14 is an enlarged plan view of the limit switch unit of this modification. FIG. 15 is an enlarged partially cutaway front view of the limit switch unit. In this limit switch unit, through holes 74c and 74d are formed in the side walls 74a and 74b of the frame 74 in the Y direction. A columnar movable member 83 is inserted into the through holes 74c and 74d to be parallel to the Y axis. A stopper 84 is fixed on the surface of the movable member 83 in the side walls 74a and 74b, and a compression coil spring 85 is interposed between the stopper 84 and the side wall 74b while surrounding the movable member 83. Therefore, when the scanning stage 9 is kept separated from the movable member 83, the stopper 84 is pressed against the side wall 74a side by the biasing force of the compression coil spring 85 in the +Y direction. The end portion of the movable member 83 in the +Y direction projects from the side wall 74a in the +Y direction. When the stopper 84 is in contact with the side wall 74a, the biasing force of the compression coil spring 85 is set to be larger than the frictional force between the scanning stage 9 and the base 10 in FIG. 8 and at the same time smaller than the average driving force between the linear motors 31A and 31B.

The operation plate 79 is fixed on the side surface of the stopper 84, and the microswitch 80 is fixed at a position where the operation plate 79 passes on the frame 74. When the microswitch 80 is brought into contact with the operation plate 79 and closed, supply of the driving current to the linear motors 31A and 31A is stopped. When the operation plate 79 is kept separated to open the microswitch 80, the linear motors 31A and 31B are driven.

In this modification, when the scanning stage 9 is moved in a direction indicated by an arrow 81 (−Y direction) to start pressing the movable member 83, the movable member 83 and the stopper 84 are moved in the −Y direction. Thereafter, when the operation plate 79 fixed to the stopper 84 comes close to the microswitch 80, the driving force from the linear motors 31A and 31B to the scanning stage 9 is eliminated. At this time, since the compression coil spring 85 has a sufficient force for pushing back the scanning stage 9, the compression coil spring 85 pushes back the scanning stage 9 in the +Y direction through the stopper 84 and the movable member 83. In addition, the microswitch 80 is opened to allow to supply the driving current to the linear motors 31A and 31B. The subsequent operation is the same as in the example shown in FIGS. 10 to 12.

The second modification of the limit switch unit 71A on the left side of FIG. 8 will be described below with reference to FIGS. 16 and 17. The same reference numerals as in FIGS. 8 to 13 denote the same parts in FIGS. 16 and 17, and a detailed description thereof will be omitted.

Figure 16:
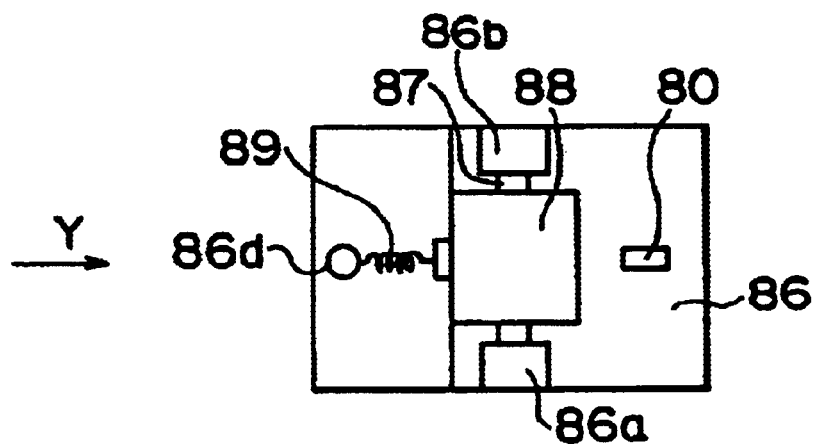
FIG. 16 is an enlarged plan view showing the second modification of the limit switch shown in FIG. 10.
Figure 17:
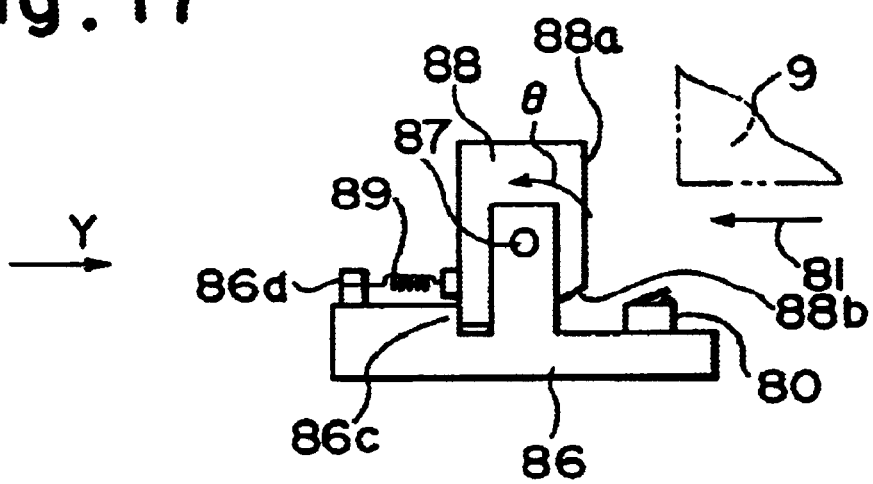
FIG. 17 is a front view of the limit switch shown in FIG. 16.

FIG. 16 is an enlarged plan view of the limit switch unit of this modification. FIG. 17 is an enlarged front view of the limit switch unit. In this limit switch unit, a rotating pin 87 is inserted into through holes in two projecting portions 86a an 86b on a base 86 to be perpendicular to the Y axis. A movable member 88 is rotatably supported about the rotating pin 87. A tensile coil spring 89 extends between the side surface of the movable member 88 in the −Y direction and a projecting portion 86d at the upper end of the base 86 in the −Y direction. A clockwise rotational force is applied to the movable member 88 by the tensile coil spring 89. However, the left side surface of the movable member 88 is in contact with a stepped portion 86c on the base 86, so that the movable member 88 is supported not to further rotate in the clockwise direction. When the movable member as is in contact with the stepped portion 86c, the biasing force by the tensile coil spring 89 is set to be larger than the frictional force between the scanning stage 9 and the base 10 in FIG. 8 and at the same time smaller than the average driving force of the linear motors 31A and 31B.

The microswitch 80 is fixed on the base 86 in the rotational direction of an inclined surface 88b on the lower right side of the movable member 88. When the microswitch 80 is brought into contact with the inclined surface 88b and closed, supply of the driving current to the linear motors 31A and 31B in FIG. 8 is stopped. When the inclined surface 88b is kept separated to open the microswitch 80, the linear motors 31A and 31B are driven.

In this modification, when the scanning stage 9 is moved in the direction indicated by the arrow 81 (−Y direction) to press a right side surface 88a of the movable member 88, the movable member 88 is rotated counterclockwise (θ direction) about the rotating pin 87. Thereafter, when the inclined surface 88b of the movable member 88 closes the microswitch 80, the driving force from the linear motors 31A and 31B to the scanning stage 9 is eliminated. At this time, since the tensile coil spring 89 has a sufficient force for pushing back the scanning stage 9, the tensile coil spring 89 pushes back the scanning stage 9 in the +Y direction through the movable member 88. In addition, the microswitch 80 is opened to allow to supply the driving current to the linear motors 31A and 31B. The subsequent operation is the same as in the example shown in FIGS. 10 to 12.

In the above embodiment, as shown in FIG. 8, the limit switch unit 71A is fixed on the base 10. However, the limit switch unit 71A may be attached to the scanning stage 9 side, and a member contacting the movable member 76 may be attached to the base 10 at a position opposing the limit switch unit 71A.

In addition, an elastic member such as a rubber member may be used in place of the tensile coil springs 77 and 78 in FIG. 10. Furthermore, instead of forming a through hole in the side wall 74b in FIG. 15, the movable member 83 may be formed of an elastic member such as a rubber member, and the scanning stage 9 may be pushed back by this elastic member.

In the above embodiment, the linear motors 31A and 31B are used as the driving unit of the scanning stage 9. However, the present invention can also be applied even when another electromagnetic driving unit such as a voice coil motor (VCM) is used. However, it is particularly preferable to use a driving unit such as a linear motor or a VCM, which allows the scanning stage 9 to freely move when the driving current is stopped.

In the above embodiment, the present invention is applied to the reticle stage of the scanning exposure apparatus. However, the present invention may also be applied to the wafer stage side. Even in a full exposure type exposure apparatus (e.g., a stepper), when the allowable movement range of the stage is defined by a limit switch, the stage can be automatically returned in the allowable movement range by applying the present invention.

To measure the coordinate position of a micropattern such as a VLSI at a high precision and manage its size, a mechanism for reading the position of a sample pattern on a wafer at a high resolving power and a high precision is needed. At the same time, the system of the entire apparatus must stably operate for a long time while guaranteeing the absolute measurement value to some extent. For example, when a 16M DRAM with a design rule of 0.5 μm is to be manufactured, the coordinate position precision of a mask to be used must be smaller than 0.05 μm. Assume a corresponding stable and highly precise measurement device. In this case, pattern edge detection can be probably performed using a light or electron beam. However, to realize the precision and reproducibility of coordinate position measurement, it is essential to make the system of the entire apparatus constituted by a drive table, an interferometer, and the like highly precise and stable.

To make the system of the entire apparatus highly precise, a drive table using a linear motor as a driving source is used. This drive table is of a direct drive type using the linear motor. The linear motor drive table need not a mechanism for converting rotational movement of a ball screw into a linear movement, so that the structure is simplified, a backlash caused by the ball screw is prevented, and the speed limit caused by the DN value of the ball screw is eliminated. With these characteristic features, a highly precise high-speed table stage can be realized.

To make the drive table highly precise, it is important to detect the accurate position of the drive table by using a laser interferometer and the like. For this purpose, the drive table must accurately perform origin detection at a predetermined position of the absolute coordinate system. Otherwise, data obtained from the interferometer becomes inaccurate.

Figure 18:
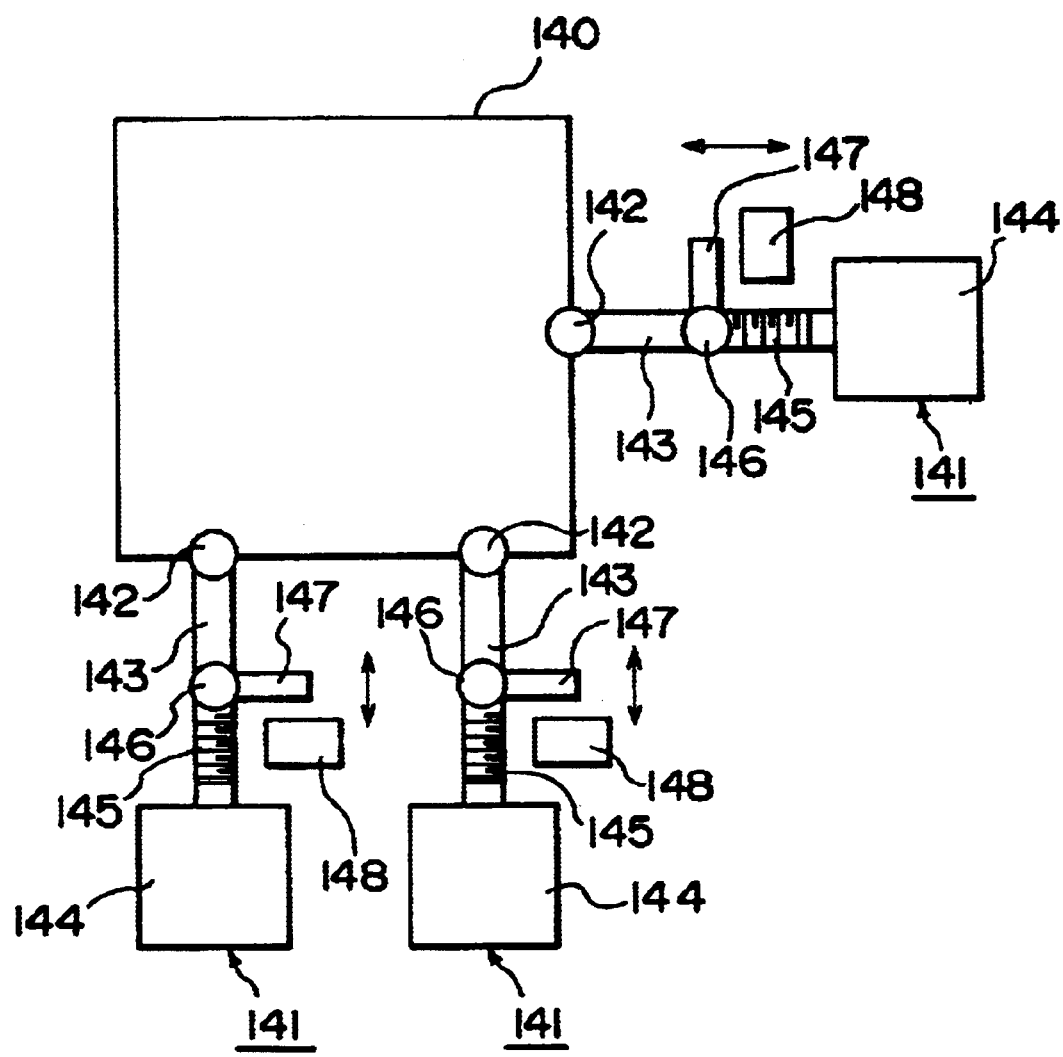
FIG. 18 is a plan view schematically showing the arrangement of a drive table.

A method for detecting the origin of the drive table in the apparatus of this type is as follows. FIG. 18 is a plan view for schematically explaining the arrangement of the drive table. As shown in FIG. 18, a total of three link mechanisms 141 are provided to a stage 140 of the drive table, i.e., two of them are provided on the wall in the X direction, and the remaining one is provided on the wall in the Y direction.

Each of the link mechanisms 141 is constituted by a link 143 having one end coupled to the stage 140 by a ball joint 142, a ball joint 146 coupled to the distal end of a ball screw 145 driven by a uniaxial actuator 144, a sensor light-shielding plate 147 attached to the ball joint 146, and a position detection sensor 148 for detecting the position of the sensor light-shielding plate 147.

With the link mechanisms 143, the stage 140 can be freely moved on the reference coordinates. In addition, the small movement of the stage 140 is detected by the position detection sensor 148 as an apparent movement of the sensor light-shielding plate 147. Therefore, a measurement value from each position detection sensor 148 is reset to a predetermined value, e.g., zero when the drive table is initialized. The to X-Y coordinate values and a rotation amount θ of the drive table are detected using the reset value as a reference position.

However, in the origin detection mechanism using such a link mechanism, when a table driving system using a uniaxial actuator and having no link mechanism is used, the position of the drive table cannot be detected, so origin detection cannot be performed.

In addition, as described above, the drive table uses a linear motor as a driving source to realize a highly precise high-speed table stage. However, when this drive table is used, and a large error occurs in origin detection, high precision cannot be achieved at all.

Third Embodiment

Figure 19:
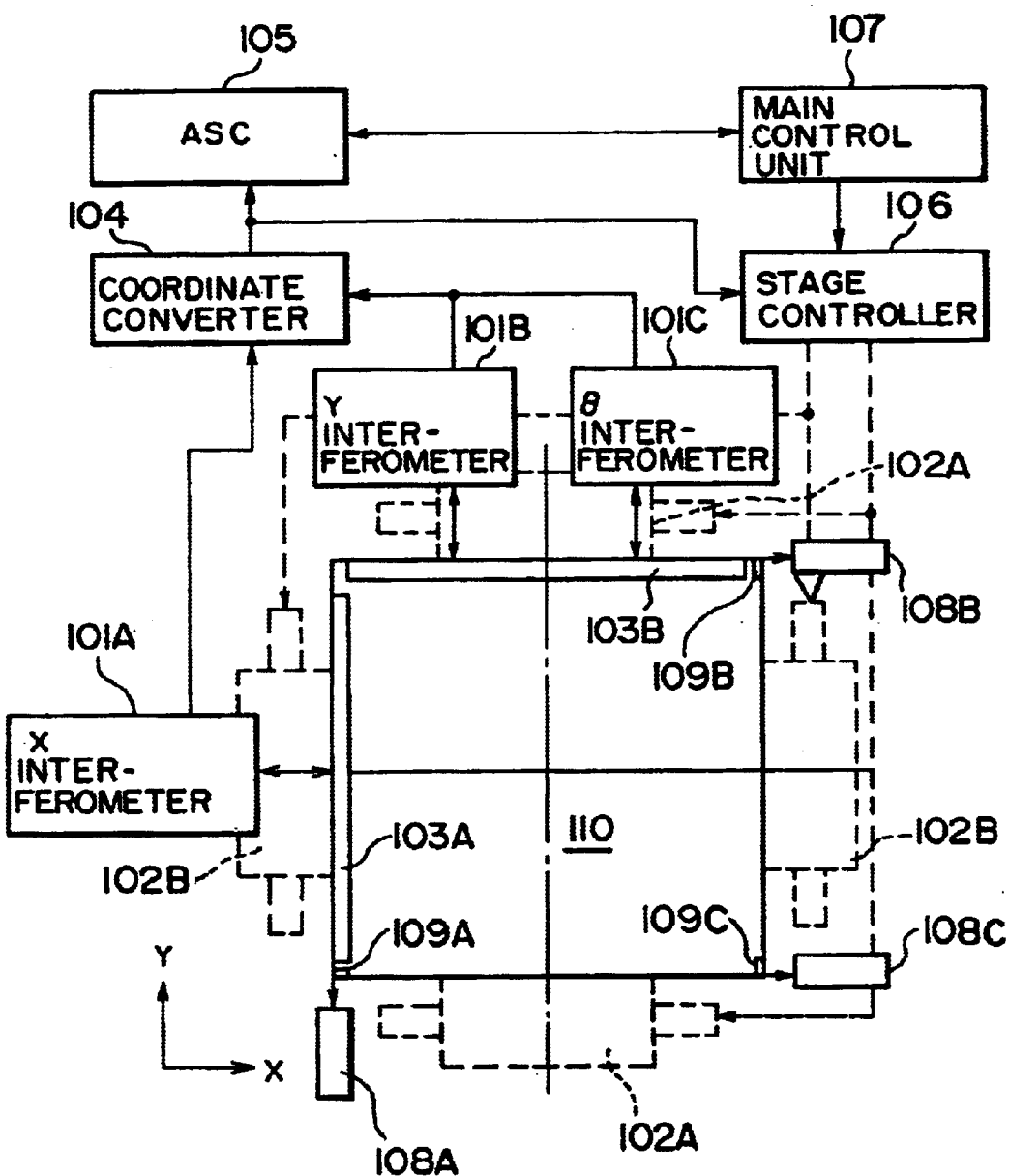
FIG. 19 is a plan view showing the arrangement of an embodiment of the drive table according to the present invention.
Figure 20:
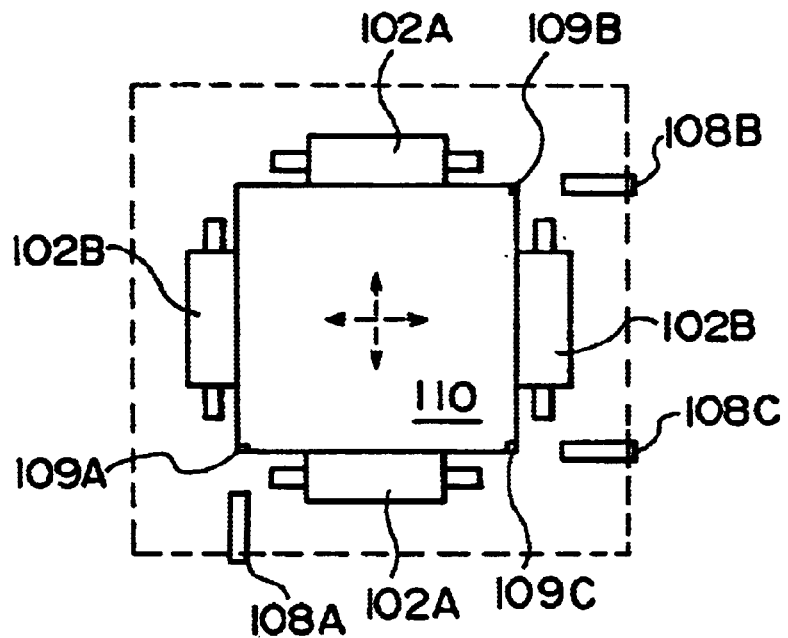
FIG. 20 is a plan view showing an origin detection method in the drive table shown in FIG. 19.

FIG. 19 is a plan view for explaining the arrangement of the third embodiment associated with the drive table of the present invention. FIG. 20 is a plan view for explaining the arrangement of origin detection in FIG. 19. As shown in FIG. 19, the two-dimensional position (including the rotational direction) of a stage 110 of the drive table is always detected by an interferometer unit consisting of three interferometers at a resolving power of, e.g., 0.02 µm.

The interferometer unit is constituted by an X interferometer 101A, a Y interferometer 101B, and a θ interferometer 101C. A plane including the three measuring axes (e.g., the central lines of laser beams) is arranged to be parallel to the stage 110 of the drive table. The measuring axis of the X interferometer 101A and that of the Y interferometer 101B are arranged to be accurately perpendicular to each other. The θ interferometer 101C is arranged to be symmetrical with respect to the Y axis of an orthogonal coordinate system X-Y.

The stage 110 is constituted by an X stage moved by an X linear motor 102A in the X direction, and a Y stage moved by a Y linear motor 102B provided on the X stage in the Y direction. A movable mirror 103A for the X interferometer and a movable mirror 103B for the Y and θ interferometers are provided at the end portions of the Y stage to extend along the X and Y directions, respectively.

The X, Y, and θ interferometers 101A to 101C irradiate laser beams to the movable mirrors 103A and 103B. The light beams reflected by the movable mirrors 103A and 103B are coaxially synthesized with light beams from fixed mirrors (not shown). With this operation, a change in interference fringes generated on the light-receiving surface is detected, and a signal according to a change in position of the movable mirror 103A or 103B is generated and output to a coordinate converter 104.

The coordinate converter 104 calculates correction coordinate values in the X and Y directions, and a θ rotation correction amount of the stage 110 on the an basis of the measurement values from the interferometers 101A to 101C. The values and amount are output to an alignment signal processing circuit (ASC) 105 and a stage controller 106 for outputting a predetermined driving command to the X and Y linear motors 102A and 102B. A main control unit 107 controls the stage controller 106 while communicating with the ASC 105.

The stage controller 106 drives the stage through the X and Y linear motors 102A and 102B in accordance with the correction coordinate values, thereby positioning the stage at a predetermined position. The θ rotation amount is corrected by finely adjusting the moving amounts of the X and Y linear motors 102A and 102B.

In the drive table 110, the measurement values from the X, Y, and θ interferometers 101A to 101C must be measurement values with respect to reference positions. Otherwise, data obtained from each interferometer becomes inaccurate. Therefore, the reference positions of the interferometers 101A to 101C must be accurately determined by a reference position detection means.

As shown in FIG. 20, as the reference position detection means for detecting the origin of the interferometer unit for measuring the coordinate value of the table stage 110 freely moved in an area surrounded by a broken line, X, Y, and θ photosensors 108A to 108C arranged on the reference coordinates of the drive table, and X, Y, and θ light-shielding plates 109A to 109C arranged at the three corners of the stage 110 of the drive table in correspondence with the photosensors are provided.

The photosensors 108A to 108C generate signals when the corresponding X, Y, and θ light-shielding plate 109A to 109C shield light to the X, Y, and θ photosensors 108A to 108C. The signals are output to the coordinate converter 104.

Therefore, the coordinate converter 104 resets the measurement values from the X and Y interferometers 101A and 101B to, e.g., zero when the X and Y light-shielding plates 109A and 109B shield light to the X and Y photosensors 108A and 108B upon movement of the stage 110. A shift between the detection value from the Y photosensor 108B with respect to the Y light-shielding plate 109B and the detection value from the θ photosensor 108C with respect to the θ light-shielding plate 109C arranged to be separated from the Y light-shielding plate 109B by a predetermined distance is calculated, thereby obtaining. the reference rotation amount with respect to an axis perpendicular to the X-Y reference coordinates of the stage 110.

In this manner, by only operating the drive table in the X and Y directions, the origin with respect to the reference coordinates can be precisely detected without impairing the characteristic features of the linear motor drive table, i.e., high speed and high precision.

Figure 21:
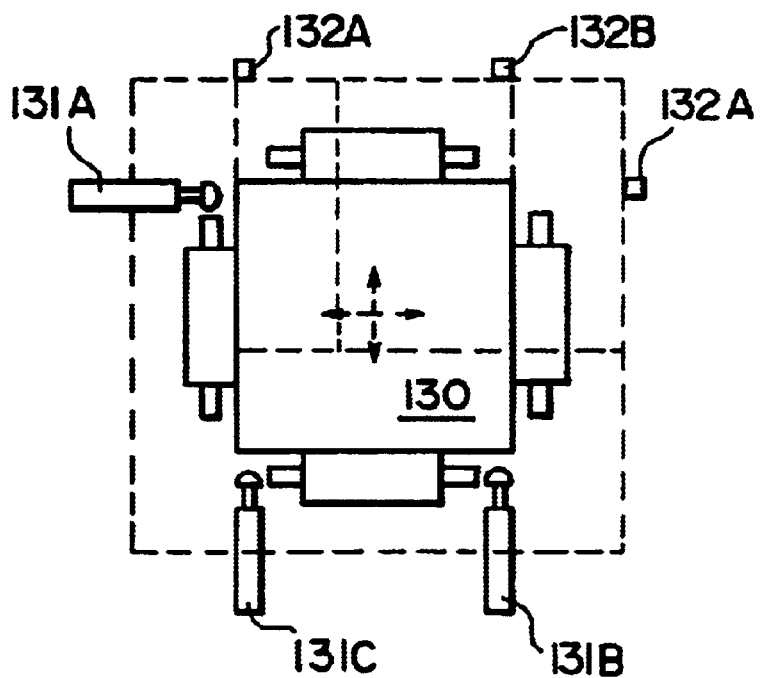
FIG. 21 is a plan view showing another origin detection method in the drive table shown in FIG. 19.

FIG. 21 is a plan view for explaining the arrangement of another origin detection. As shown in FIG. 21, a stage 130 of the drive table is a drive table having an interferometer unit consisting of X, Y, and θ interferometers, as in FIG. 19.

To detect the origin of the interferometer unit for measuring the coordinate value of the table stage 130 freely moved in an area surrounded by a broken line, an X air cylinder 131A for pressing the table stage in the X direction, a Y air cylinder 131B for pressing the table stage 130 in the Y direction, a θ air cylinder 131C for pressing the table stage 130 in the Y direction in synchronism with the Y air cylinder, and X, Y, and θ reference stoppers 132A to 132C arranged to be oppose the X, Y, and θ air cylinders, respectively, are provided.

Origin detection is performed in detail in the following manner. The table stage 130 is pressed against the X reference stopper 132A by the X air cylinder 131A in accordance with, e.g., a command from a control means (not shown) for controlling driving of the air cylinders. When the table stage is pressed against the stopper 132A, and the operation of the X air cylinder 131A is completed, the control means detects it and sends a signal to the coordinate converter 104. The measurement value from the X interferometer at this time is set to a predetermined value, thereby detecting the origin of the X coordinate. The origin of the Y coordinate is detected in the same manner.

As for the rotation amount θ of the stage, the stage 130 is pressed against the θ reference stopper 132C by the θ air cylinder 131C in synchronism with the Y air cylinder 131B, thereby canceling the small rotation amount with respect to the Y coordinate (i.e., X coordinate). Upon completion of the operation of the θ air cylinder 131C, the measurement value from the θ interferometer is set to a predetermined value, thereby detecting the origin of θ.

In this manner, when the stage 130 is pressed against the reference stoppers 132A to 132C provided at positions opposing the air cylinders 131A to 131C by the air cylinders 131A to 131C, origin detection can be satisfactorily performed. Completion of pressing of each air cylinder is determined by the operation of the air cylinder. However, it may be detected by a press sensor arranged to the reference stopper.

As described above, according to the drive table of the present invention, a position detection sensor or a mechanism for forcibly moving the drive table is provided to the drive table. With this arrangement, even when the drive table and the driving actuator do not constitute a link mechanism, origin detection can be performed. In this embodiment, a non-contact type driving system such as a linear motor is used. However, a contact type driving system may also be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 156429/1994 filed on Jun. 16, 1994, 153458/1994 filed on Jul. 5, 1994 and 268546/1994 filed on Nov. 1, 1994 are hereby incorporated by reference.

What is claimed is:

1. A stage apparatus for scanning an object that includes at least one of a mask and a photosensitive substrate, said stage apparatus being provided to a scanning exposure apparatus that illuminates said mask on which a transfer pattern is formed and scans said mask in a predetermined scanning direction and synchronously scans said substrate in a direction corresponding to said scanning direction, thereby exposing said pattern on said mask onto said substrate, comprising:

a base;

a scanning stage that is movable in said scanning direction on said base;

a fine adjustment stage that is movable within predetermined ranges in said scanning direction and in a direction perpendicular to said scanning direction with respect to said scanning stage, said fine adjustment stage mounting said object thereon, said fine adjustment stage having a movable mirror;

actuators arranged in said scanning direction and in the direction perpendicular to said scanning direction with respect to said scanning stage for driving said fine adjustment stage;

an interferometer that irradiates a measurement light beam on said movable mirror to detect a displacement of said fine adjustment stage with respect to said scanning stage; and a cooling unit that cools said actuators by circulating a predetermined cooling fluid, said cooling unit circulating said cooling fluid from a portion near an optical path of the light beam from said interferometer toward the actuators.

2. An apparatus according to claim 1, wherein said fine adjustment stage mounts said mask thereon, and further comprising a substrate stage on which said substrate is mounted.

3. An apparatus according to claim 1, wherein said fine adjustment stage mounts said substrate thereon, and further comprising a mask stage on which said mask is mounted.

4. An apparatus according to claim 1, wherein at least one of said actuators is constituted by a pair of subactuators which are parallelly arranged.

5. A stage apparatus comprising:

a first stage that is movable linearly in a first direction;

a second stage that is movable in said first direction and in a second direction perpendicular to said first direction with respect to said first stage;

a first actuator having a first coil member and a first magnetic member to drive said second stage with a second thrust in said second direction with respect to said first stage; and a second actuator having a second coil member and a second magnetic member to drive said second stage with a first thrust in said first direction with respect to said first stage, said first thrust being larger than said second thrust.

6. An apparatus according to claim 5, wherein said first actuator is an electromagnetic actuator of a moving magnet type, and said first coil member of said first actuator is fixed to said first stage.

7. An apparatus according to claim 5, wherein said second actuator is an electromagnetic actuator of a moving magnet type, and said second coil member of said second actuator is fixed to said first stage.

8. An apparatus according to claim 6, further comprising a cooling unit that cools said first coil member of said first actuator by circulating a cooling fluid.

9. An apparatus according to claim 7, further comprising a cooling unit that cools said second coil member of said second actuator by circulating a cooling fluid.

10. An apparatus according to claim 8, wherein said second stage has a movable mirror; and further comprising:

an interferometer that irradiates a measurement light beam on said movable mirror to detect a displacement of said second stage with respect to said first stage;

wherein said cooling unit circulates said cooling fluid from a portion near an optical path of the light beam from said interferometer toward a distant portion.

11. An apparatus according to claim 9, wherein said second stage has a movable mirror; and further comprising:
an interferometer that irradiates a measurement light beam on said movable mirror to detect a displacement of said second stage with respect to said first stage; and
wherein said cooling unit circulates said cooling fluid from a portion near an optical path of the light beam from said interferometer toward a distant portion.

12. An apparatus according to claim 5, wherein at least one of said first and second actuators is constituted by a pair of subactuators which are parallelly arranged.

13. A stage apparatus comprising:
a first stage that is movable linearly in a first direction;
a second stage that is movable in said first direction and in a second direction perpendicular to said first direction with respect to said first stage;
a base that supports said first stage and said second stage;
a position detector having an interferometer that cooperates with a reflective portion of said second stage, said interferometer being supported by said base;
a first electromagnetic actuator having a first moving member to drive said second stage with a second thrust in said second direction with respect to said first stage; and
a second electromagnetic actuator that is different from said first electromagnetic actuator and has a second moving member to drive said second stage with a first thrust in said first direction with respect to said first stage, said first thrust being different from said second thrust and a weight of said moving member being different from a weight of said second moving member;
said second stage is a guideless stage having no associated guide member, other than said first and second electromagnetic actuators, to guide movement of said second stage in the first and second directions.

14. An apparatus according to claim 13, wherein said first moving member comprises a magnet member, and a first coil member of said first electromagnetic actuator is fixed to said first stage.

15. An apparatus according to claim 13, wherein said second moving member comprises a magnet member, and a second coil member of said second electromagnetic actuator is fixed to said first stage.

16. An apparatus according to claim 14, further comprising a cooling unit that cools said first coil member of said first electromagnetic actuator by circulating a cooling fluid.

17. An apparatus according to claim 15, further comprising a cooling unit that cools said second coil member of said second electromagnetic actuator by circulating a cooling fluid.

18. An apparatus according to claim 16,
wherein said cooling unit circulates said cooling fluid from a portion near an optical path of a light beam from said interferometer toward said first coil member.

19. An apparatus according to claim 17,
wherein said cooling unit circulates said cooling fluid from a portion near an optical path of a light beam from said interferometer toward said second coil member.

20. An apparatus according to claim 13, wherein at least one of said first and second electromagnetic actuators is constituted by a pair of subactuators which are parallelly arranged.

21. A stage apparatus for scanning an object that includes at least one of a mask and a photosensitive substrate, said stage apparatus being provided to a scanning exposure apparatus that illuminates said mask on which a transfer pattern is formed and scans said mask in a predetermined scanning direction and synchronously scans said substrate in a direction corresponding to said scanning direction, thereby exposing said pattern on said mask onto said substrate, comprising:
a base;
a scanning stage that is movable in said scanning direction on said base;
a fine adjustment stage that is movable within predetermined ranges in said scanning direction and in a non-scanning direction perpendicular to said scanning direction with respect to said scanning stage, said fine adjustment stage mounting said object thereon;
a first actuator arranged in said scanning direction to drive said fine adjustment stage in said scanning direction;
a second actuator arranged in said non-scanning direction to drive said fine adjustment stage in said non-scanning direction, a weight of said first actuator being different from a weight of said second actuator; and
a cooling unit that cools said actuators by circulating a predetermined cooling fluid, said cooling unit circulating said cooling fluid from said actuators arranged in the direction perpendicular to said scanning direction with respect to said scanning stage for driving said fine adjustment stage.

22. An apparatus according to claim 21, wherein said fine adjustment stage mounts said mask thereon, and further comprising a substrate stage on which said substrate is mounted.

23. An apparatus according to claim 21, wherein said fine adjustment stage mounts said substrate thereon, and further comprising a mask stage on which said mask is mounted.

24. An apparatus according to claim 21, wherein said first actuator is a moving magnet type, and a stationary member having a coil of said first actuator is fixed to said scanning stage.

25. An apparatus according to claim 24, wherein said cooling unit cools said stationary member.

26. An apparatus according to claim 21, wherein said second actuator is a moving magnet type, and a stationary member having a coil of said second actuator is fixed to said scanning stage.

27. An apparatus according to claim 26, wherein said cooling unit cools said stationary member.

28. An apparatus according to claim 21, wherein at least one of said first and second actuators is constituted by a pair of subactuators which are parallelly arranged.

29. A lithographic device comprising in a following order:
a substrate stage that is positionable by a first positioning device parallel to a first direction in order to position a substrate;
an imaging system having a main axis directed parallel to a vertical direction perpendicular to the first direction;
a mask stage that is positionable at least parallel to the first direction by a second positioning device in order to position a mask; and
an illumination optical system that irradiates an exposure illumination light beam;
wherein the second positioning device includes a first actuator that positions the mask stage over a comparatively small movement parallel to the first direction, and a second actuator that positions the mask stage over a comparatively large movement parallel to the first direction, the first actuator being driven to prevent a positional error of the mask at least when the second actuator is being at least one of accelerated and decelerated.

30. A device according to claim 29, wherein said first actuator is an electromagnetic actuator of a moving magnet type, and a stationary member having a coil of said first actuator is fixed to a support.

31. A device according to claim 30, further comprising a cooling unit that cools said stationary member by circulating a cooling fluid.

32. A device according to claim 31, wherein a portion of said mask stage that moves with a moving magnet of said first actuator has a movable mirror; and further comprising:
an interferometer that irradiates a measurement light beam on said movable mirror to detect a displacement of said portion that moves with said moving magnet relative to said support;
wherein said cooling unit circulates said cooling fluid from a portion near an optical path of the light beam from said interferometer toward a distant portion.

33. A device according to claim 29, wherein said first actuator is an electromagnetic actuator constituted by a pair of subactuators which are parallelly arranged.

34. A semiconductor element made by utilizing the lithographic device of claim 29.

35. A liquid crystal display element made by utilizing the lithographic device of claim 29.

36. A scanning exposure apparatus that moves a mask with respect to a projection optical system while illuminating said mask on which a transfer pattern is formed and synchronously moves a photosensitive substrate with respect to said projection optical system, thereby projecting and exposing said pattern on said mask onto said substrate through said projection optical system, comprising:
a base that holds the following elements;
a scanning stage that is movable, with respect to said base, along a first direction corresponding to a moving direction of said mask and said substrate;
a fine adjustment stage that is movable along the first direction with respect to said scanning stage, said fine adjustment stage mounting one of said mask and said substrate, and a size of said fine adjustment stage being smaller than a size of said scanning stage; and
an actuator that drives said fine adjustment stage to prevent a positional error between said scanning stage and said fine adjustment stage at least when said scanning stage is being at least one of accelerated and decelerated during a scanning exposure operation.

37. An apparatus according to claim 36, wherein said fine adjustment stage mounts said mask thereon, and further comprising a substrate stage on which said substrate is mounted.

38. An apparatus according to claim 36, wherein said fine adjustment stage mounts said substrate thereon, and further comprising a mask stage on which said mask is mounted.

39. An apparatus according to claim 36, wherein said actuator is an electromagnetic actuator of a moving magnet type, and a stationary member having a coil of said electromagnetic actuator is fixed to said scanning stage.

40. An apparatus according to claim 39, further comprising a cooling unit that cools said stationary member of said electromagnetic actuator by circulating a cooling fluid.

41. An apparatus according to claim 40, wherein said fine adjustment stage has a movable mirror; and further comprising:
an interferometer that irradiates a measurement light beam on said movable mirror to detect a displacement of said fine adjustment stage with respect to said scanning stage;
wherein said cooling unit circulates said cooling fluid from a portion near an optical path of the light beam from said interferometer toward a distant portion.

42. An apparatus according to claim 36, wherein said actuator is constituted by a pair of subactuators which are parallelly arranged.

43. A semiconductor element made by utilizing the scanning exposure apparatus of claim 36.

44. A liquid crystal display element made by utilizing the scanning exposure apparatus of claim 36.

45. A stage apparatus comprising:
a first stage that is linearly movable in a first direction;
a second stage that is movable in said first direction with respect to said first stage, a size of said second stage being smaller than a size of said first stage; and
an actuator that drives said second stage in said first direction, said actuator driving said second stage at least when said first stage is being at least one of accelerated and decelerated, said actuator having a first portion connected to said first stage and a second portion connected to said second stage.

46. An apparatus according to claim 45, wherein said actuator is an electromagnetic actuator of a moving magnet type, and said first portion having a coil.

47. An apparatus according to claim 46, further comprising a cooling unit that cools said first portion of said electromagnetic actuator by circulating a cooling fluid.

48. An apparatus according to claim 47, wherein said second stage has a movable mirror; and further comprising:
an interferometer that irradiates a measurement light beam on said movable mirror to detect a displacement of said second stage with respect to said first stage;
wherein said cooling unit circulates said cooling fluid from a portion near an optical path of the light beam from said interferometer toward a distant portion.

49. An apparatus according to claim 45, wherein said actuator is constituted by a pair of subactuators which are parallelly arranged.

50. A stage driving method for driving, in a predetermined direction, a first stage that is arranged to be movable linearly in a first direction and for driving a second stage that is arranged to be movable at least in said first direction with respect to said first stage, comprising the steps of:
providing an actuator to drive said second stage, said actuator having a first portion connected to said first stage and a second portion connected to said second stage;
driving said first stage; and
driving said second stage to prevent a positional error between said first stage and said second stage at least when said first stage is being at least one of accelerated and decelerated, a size of said second stage being smaller than a size of said first stage.

51. A method according to claim 50, wherein said second stage is driven by an electromagnetic actuator of a moving magnet type, and said first portion having a coil.

52. A method according to claim 51, further comprising the step of cooling said stationary member of said first portion by circulating a cooling fluid.

53. A method according to claim 52, wherein said second stage has a movable mirror, said method further comprising the step of:

irradiating a measurement light beam from an interferometer on said movable mirror to detect a displacement of said second stage with respect to said first stage, wherein a cooling unit circulates said cooling fluid from a portion near an optical path of the light beam from said interferometer toward a distant portion.

54. A method according to claim 50, wherein an electromagnetic actuator that drives said second stage is constituted by a pair of subactuators which are parallelly arranged.

55. A stage driving method for scanning an object that includes at least one of a mask and a photosensitive substrate, in a scanning exposure apparatus that illuminates said mask on which a transfer pattern is formed and scans said mask in a predetermined scanning direction and synchronously scans said substrate in a direction corresponding to said scanning direction, thereby exposing said pattern onto said substrate, said method comprising the steps of:

driving a first stage in said scanning direction, said first stage being used for scanning one of said mask and said substrate; and driving a second stage in said scanning direction by an actuator having a first portion connected to said first stage and a second portion connected to said second stage to prevent a positional error between said first stage and said second stage at least when said first stage is being at least one of accelerated and decelerated during said scanning exposure, said second stage being movable in said scanning direction with respect to said first stage, and said second stage mounting said object thereon, and a size of said second stage being smaller than a size of said first stage.

56. A method according to claim 55, wherein said second stage mounts said mask thereon, and said scanning exposure apparatus further comprises a substrate stage on which said substrate is mounted.

57. A method according to claim 55, wherein said second stage mounts said substrate thereon, and said scanning exposure apparatus further comprises a mask stage on which said mask is mounted.

58. A method according to claim 55, wherein said actuator is of a moving magnet type, and said first portion having a coil.

59. A method according to claim 58, further comprising the step of cooling said first portion by circulating a cooling fluid.

60. A method according to claim 59, wherein said second stage includes a movable mirror, said method further comprising the step of:

irradiating a measurement light beam from an interferometer on said movable mirror to detect a displacement of said second stage with respect to said first stage, wherein a cooling unit circulates said cooling fluid from a portion near an optical path of the light beam from said interferometer toward a distant portion.

61. A method according to claim 55, wherein said actuator is an electromagnetic actuator that is constituted by a pair of subactuators which are parallelly arranged.

62. A method for making an exposure apparatus that transfers a pattern of a mask onto a substrate, comprising the steps of:

providing a substrate stage on which said substrate is mounted;

providing a first positioning device that positions said substrate stage parallel to a first direction;

providing an imaging system having a main axis directed parallel to a vertical direction and perpendicular to the first direction;

providing a mask stage on which said mask is mounted;

providing a second positioning device that positions said mask stage at least parallel to the first direction; said second positioning device having a first actuator that positions said mask stage over a comparatively small movement parallel to the first direction, and a second actuator that positions said mask stage over a comparatively great movement parallel to the first direction, the first actuator being driven at least to prevent a positional error of said mask when the second actuator is being at least one of accelerated and decelerated; and providing an illumination optical system that irradiates an exposure illumination light beam.

63. A method according to claim 62, wherein said first actuator is an electromagnetic actuator of a moving magnet type, and a stationary member having a coil of said electromagnetic actuator is fixed to a support.

64. A method according to claim 63, further comprising the step of providing a cooling unit that cools said stationary member of said electromagnetic actuator by circulating a cooling fluid.

65. A method according to claim 64, wherein a portion of said mask stage that moves with a moving magnet of said electromagnetic actuator has a movable mirror; and further comprising the step of:

providing an interferometer that irradiates a measurement light beam on said movable mirror to detect a displacement of said portion of said mask stage that moves with said moving magnet relative to said support, wherein said cooling unit circulates said cooling fluid from a portion near an optical path of the light beam from said interferometer toward a distant portion.

66. A method according to claim 62, wherein said first actuator is constituted by a pair of subactuators which are parallelly arranged.

67. A method of making a semiconductor element comprising utilizing the exposure apparatus made by a method according to claim 62.

68. A method of making a liquid crystal display element comprising utilizing the exposure apparatus made by a method according to claim 62.

69. A method of operating an exposure apparatus to transfer a pattern on a mask onto a substrate, the apparatus having a projection optical system, a first stage that is movable along a first direction with respect to the projection optical system, and a second stage that is movable along the first direction with respect to the first stage, the second stage mounting one of said mask and said substrate thereon, the method comprising the steps of:

driving the first stage in the first direction; and driving the second stage in the first direction to prevent a positional error between said first stage and said second stage at least when the first stage is being at least one of accelerated and decelerated, a size of the second stage being smaller than a size of the first stage.

70. A method according to claim 69, wherein said second stage mounts said mask thereon, and said exposure apparatus further comprises a substrate stage on which said substrate is mounted.

71. A method according to claim 69, wherein said second stage mounts said substrate thereon, and said exposure apparatus further comprises a mask stage on which said mask is mounted.

72. A method according to claim 69, wherein an electromagnetic actuator that drives said second stage is of a moving magnet type, and a stationary member having a coil of said electromagnetic actuator is fixed to said first stage.

73. A method according to claim 72, further comprising the step of cooling said stationary member of said electromagnetic actuator by circulating a cooling fluid.

74. A method according to claim 73, wherein said second stage includes a movable mirror, said method further comprising the step of:
irradiating a measurement light beam from an interferometer on said movable mirror to detect a displacement of said second stage with respect to said first stage, wherein a cooling unit circulates said cooling fluid from a portion near an optical path of the light beam from said interferometer toward a distant portion.

75. A method according to claim 69, wherein said second stage is driven by an electromagnetic actuator that is constituted by a pair of subactuators which are parellelly arranged.

76. A method of making a semiconductor element comprising operating an exposure apparatus according to claim 69.

77. A method of making a liquid crystal display element comprising operating an exposure apparatus according to claim 69.

* * * * *